(12) United States Patent
Gillies et al.

(10) Patent No.: US 7,723,744 B2
(45) Date of Patent: May 25, 2010

(54) LIGHT-EMITTING DEVICE HAVING SEMICONDUCTOR NANOCRYSTAL COMPLEXES

(75) Inventors: Jennifer Gillies, Petersburg, NY (US); David Socha, Glenmont, NY (US); Kwang-Ohk Cheon, Holland, PA (US); Michael LoCasio, Clifton Park, NY (US)

(73) Assignee: Evident Technologies, Inc., Troy, NY (US)

( * ) Notice: Subject to any disclaimer, the term of this patent is extended or adjusted under 35 U.S.C. 154(b) by 0 days.

(21) Appl. No.: 11/952,783

(22) Filed: Dec. 7, 2007

(65) Prior Publication Data
US 2008/0246017 A1 Oct. 9, 2008

Related U.S. Application Data

(60) Provisional application No. 60/873,532, filed on Dec. 8, 2006, provisional application No. 60/875,604, filed on Dec. 19, 2006.

(51) Int. Cl.
*H01L 27/15* (2006.01)
(52) U.S. Cl. ............ 257/98; 257/94; 257/788; 257/E25.032
(58) Field of Classification Search ............ None
See application file for complete search history.

(56) References Cited

U.S. PATENT DOCUMENTS

| 6,734,465 | B1 | 5/2004 | Taskar et al. |
| 2002/0070681 | A1* | 6/2002 | Shimizu et al. ............ 315/246 |
| 2006/0066210 | A1 | 3/2006 | Ng et al. |
| 2007/0012928 | A1* | 1/2007 | Peng et al. .................. 257/79 |
| 2008/0106887 | A1* | 5/2008 | Salsbury et al. ............ 362/84 |

FOREIGN PATENT DOCUMENTS

| WO | 2005098976 A2 | 10/2005 |
| WO | 2006055456 A1 | 5/2006 |

OTHER PUBLICATIONS

PCT/US2007/086819—International Search Report and Written Opinion dated Feb. 25, 2009.

* cited by examiner

*Primary Examiner*—Evan Pert
*Assistant Examiner*—Scott R Wilson
(74) *Attorney, Agent, or Firm*—Hoffman Warnick LLC

(57) ABSTRACT

Light-emitting devices are provided that incorporate one or more underlying LED chips or other light sources and a layer having one or more populations of nanoparticles disposed over the light source. The nanoparticles may absorb some light emitted by the underlying source, and re-emit light at a different level. By varying the type and relative concentration of nanoparticles, different emission spectra may be achieved. White light and specialty-color emission may be achieved. Devices also may include multiple LED chips, with nanoparticles disposed over one or more underlying chips in an array.

30 Claims, 27 Drawing Sheets

LIGHT-EMITTING DEVICE HAVING SEMICONDUCTOR NANOCRYSTAL COMPLEXES

RELATED APPLICATIONS

This application claims the benefit of U.S. Provisional Application No. 60/873,532, filed Dec. 8, 2006, and U.S. Provisional Application No. 60/875,604, filed Dec. 19, 2006, each of which is incorporated herein by reference in its entirety.

BACKGROUND

Semiconductor nanocrystals are tiny crystals typically made of II-VI, III-V, IV-VI, and I-III-VI semiconductor materials that have a diameter between 1 nanometer (nm) and 20 nm. In the strong confinement limit, the physical diameter of the nanocrystal is smaller than the bulk excitation Bohr radius causing quantum confinement effects to predominate. In this regime, the nanocrystal is a 0-dimensional system that has both quantized density and energy of electronic states where the actual energy and energy differences between electronic states are a function of both the nanocrystal composition and physical size. Larger nanocrystals have more closely spaced energy states and smaller nanocrystals have the reverse. Because interaction of light and matter is determined by the density and energy of electronic states, many of the optical and electric properties of nanocrystals can be tuned or altered simply by changing the nanocrystal geometry (i.e. physical size).

Nanocrystals or populations of nanocrystals exhibit unique optical properties that are size tunable. Both the onset of absorption and the photoluminescent wavelength are a function of nanocrystal size and composition. The nanocrystals will absorb all wavelengths shorter than the absorption onset, however, photoluminescence will always occur at the absorption onset. The bandwidth of the photoluminescent spectra is due to both homogeneous and inhomogeneous broadening mechanisms. Homogeneous mechanisms include temperature dependent Doppler broadening and broadening due to the Heisenburg uncertainty principle, while inhomogeneous broadening is due to the size distribution of the nanocrystals. The narrower the size distribution of the nanocrystals, (i.e. a more monodisperse population of nanocrystals) the narrower the full-width half max (FWHM) of the resultant photoluminescent spectra.

A light-emitting diode (LED) is a special type of semiconductor diode. Like a normal diode, it consists of a chip of semiconducting material impregnated, or doped, with impurities to create a structure called a p-n junction. As in other diodes, current flows easily from the p-side, or anode to the n-side, or cathode, but not in the reverse direction. Charge-carriers—electrons and holes—flow into the junction from electrodes with different voltages. When an electron meets a hole, it falls into a lower energy level, and releases energy in the form of a photon. The wavelength of the light emitted, and therefore its color, depends on the on the bandgap energy of the materials forming the p-n junction. The materials used for an LED typically have a direct bandgap with energies corresponding to near-infrared, visible, or near-ultraviolet light.

Over the past decade there has been significant interest in white light emitting LEDs, liquid crystal display backlighting, projection displays and projectors, outdoor/landscape lighting luminaires, interior illumination in the transportation sector (airplanes, subways, ships, etc.), automobiles, and cell phones and other mobile electronics. Outside of white LEDs there also exists a market for specialty color LEDs particularly aqua, gold, purple, pink, and green used in signage, corporate and product branding and architectural and specialty lighting.

The most common method to achieve white light or specialty-colored light emission from an LED is to combine a powdered phosphor and a blue (450-470 nm emission wavelength) InGaN light emitting diode chip. The phosphor absorbs a portion of the light emitted by the underlying blue LED and down converts the emission of the blue InGaN LED to longer wavelengths. The LED is typically placed and wire bonded in a reflector cup and subsequently coated with a phosphor-containing epoxy. The phosphor is either deposited within the entirety of the reflector cup or is conformal coating on the LED chip itself. The blue light emitted from the LED is absorbed by the powdered phosphor and re-emitted as a light of a longer wavelength, typically yellow. The blue light from the InGaN LED and the generally yellow light from the phosphor combine to form white light. Yttrium aluminum garnet (YAG:Ce3+) is the most common phosphor for this application. A typical emission spectrum of the white light LEDs prepared by combining YAG with a blue light has two distinct peaks.

Since standard white light LEDs use a single broadband yellow phosphor, their respective color temperature is fixed to approximately 6500K. Variation in the underlying LED emission wavelength and the substitution of YAG:Ce for TAG:Ce will shift standard white to 5600K. In any case the color temperatures are fixed. There is significant demand for warm whites having color temperatures correlated color temperatures (CCT) less than 4000 k, particularly less than 3300K and more particularly less than 2800K. There is also some demand for white having CCT greater than 10,000K. None of these white can be reached by the use of single color yellow phosphor plus the underlying blue LED.

"Warm whites" having color temperatures between 3300K and 4500K have been achieved by the addition of "red" Calcium Sulfide and certain Europium doped orthosilicates and nitride based phosphors. However "warm white" LEDs made from a combination of yellow and red have reduced efficiency owing to the lower quantum yield of the red phosphors and also because the red phosphors are broadband emitters. Broadband red emitters have a significant portion of their spectrum in the deep red where the eye is less sensitive. More narrowband green, and particularly red emitters situated at more optimal peak wavelengths would provide increased luminous efficacy warm whites than are presently available.

A second problem associated with traditional white-light LEDs comprising 450-470 nm blue LEDs with a broadband yellow YAG:Ce phosphor is that often the "red", "green", or "blue" portions of the emitted spectrum light does not adequately match the spectrum of a true white blackbody spectrum. This leads to a problem that a matter to be displayed in red looks subdued. This problem is often referred to as poor color rendering. Color rendering is an evaluation of how colors appear under a given light source. For example, a shade of red can be rendered more pink, more yellow, lighter or darker depending on the characteristics of the illumination falling on it.

Another method of creating white light with LEDs is by using a multichip array of closely spaced individual "red", "green", and "blue" LED chips. If the individual chips are located close to one another the human eye will not be able to resolve individual LEDs and instead blends the individual red, green, and blue emission into white. Because phosphor are not used there is a potential for increased efficiency over white LEDs derived from "yellow" phosphor coated "blue"

LEDs. Another advantage is that the intensity of each wavelength component of the multichip array can be varied independently because each chip is separately driven. Thus multichip arrays can be actively tuned to achieve various color whites (different CCTs) or specialty colors. The three LEDs can together emit light having a high color rendering index (CRI), while even higher CRI's can be achieved by adding a fourth amber LED to the multichip array or even more LEDs emitting at different wavelengths.

However, white light emitting multichip arrays suffer from some drawbacks. Green LEDs particularly those that emit light are 555 nm (where the human eye is most sensitive) are notoriously inefficient. Thus, a greater number of green emitting LEDs are needed in the array to achieve sufficient light output. This results in increased costs and reduced efficacy. Furthermore, it is well known that each type of LEDs chips degrade at a different rate over time and have an intensity and peak emission wavelengths that are affected differently by changes in temperatures. Thus, it is a general requirement that multichip arrays incorporate optical detectors and electrical power feedback to each individual chip in order to compensate for different aging and temperature responses.

In addition to white light LEDs, specialty colored LEDs can be produced by the addition of phosphors to underlying blue or UV LEDs. Improved green and yellow-green LEDs may be desirable because, for example, conventional green LED chips are very inefficient, the human eye is most sensitive to green (particularly 555 nm green), and green is used for full color signage or sequential LCD or projection display applications. There is also a need for purple, pink, gold, aqua and other colors that simply cannot be achieved with a single-wavelength LED source.

SUMMARY OF THE INVENTION

Devices according to embodiments of the invention may include a light source typically having a peak emission wavelength between 450 nm and 480 nm, an active layer disposed over the light-emitting diode chip, and one or more populations of semiconductor nanocrystals disposed within the active layer, where the semiconductor nanocrystals are capable of emitting light having a peak emission wavelength. The light emitted by the device may correspond to a pre-selected emission color. A second population of semiconductor nanocrystals may be disposed within the active layer, and may emit light having a peak emission wavelength different from that of the first population.

Devices according to embodiments of the invention also may include a first LED chip configured to emit light at a first wavelength, a second LED chip configured to emit light at a second wavelength different from the first wavelength, an active layer disposed over the first LED chip, and a population of semiconductor nanocrystals disposed within the active layer, the semiconductor nanocrystals configured to emit light at a third wavelength different from the first and second wavelengths.

DETAILED DESCRIPTION

Light-emitting devices according to embodiments of the invention may incorporate one or more underlying light source such as a LED chip or other light source and a layer having one or more populations of semiconductor nanocrystals disposed in an active layer over the light source. The nanocrystals may absorb some light emitted by the underlying source, and re-emit light having a different spectrum and/or peak wavelength. By varying the type and relative concentration of nanocrystals in the active layer, different emission spectra may be achieved. For example, light having a specific color, including light having specific CIE coordinates, and white light at a variety of temperatures, specialty-color emission, and saturated emission spectra may be achieved. Devices also may include multiple underlying LED chips, with nanocrystals disposed in one or more active layers over the underlying LEDs.

Figure 1:
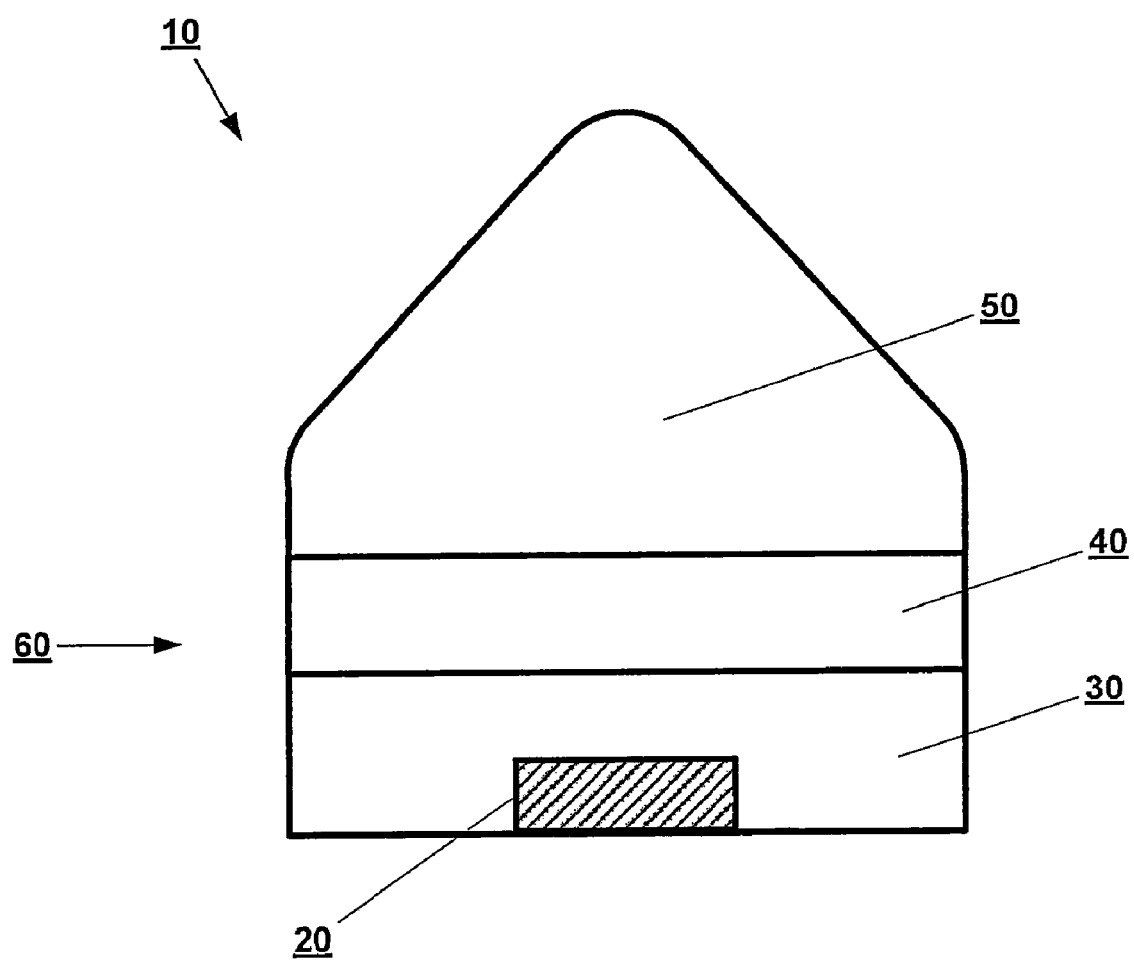
FIG. 1 shows an exemplary single chip light-emitting device according to an embodiment of the invention.

FIG. 1 shows a schematic view of a light-emitting device such as a solid-state lighting device according to an embodiment of the invention. The light-emitting device 10 may include a light source 20 such as an LED chip, other solid-state devices such as a laser, or other light source, a first encapsulant layer 30, an active layer 40 that may include one or more populations of semiconductor nanocrystals admixed within a thermal or UV curable matrix material, a second encapsulant layer 50 that may form or include a lenscap, and a frame and reflector cup 60.

The active layer 40 may be made from a matrix material comprising a polymer or silicone having a plurality of cross-linked acrylate groups. One or more populations of semiconductor nanocrystals may be disposed within the matrix. Typically, the matrix material preferably is transparent to both the wavelength of light emitted by the underlying light source and the light wavelength(s) emitted by each population of semiconductor nanocrystals dispersed within it. Non-limiting examples of acrylated polymers and silicones include urethane acrylate, polyacrylate, acrylated silicone, urethane acrylate epoxy mixture, or a combination thereof. Particularly preferred acrylated polymers or silicones are OP-54™ (Dymax) and ZIPCONE™ (Gelest).

A semiconductor nanocrystal may include a semiconductor nanocrystal core (also known as a semiconductor nanoparticle or semiconductor quantum dot) having an outer surface. The semiconductor nanocrystal core may be spherical nanoscale crystalline materials (although oblate and oblique spheroids can be grown as well as rods and other shapes) having a diameter of less than the Bohr radius for a given material and typically but not exclusively comprises one or more semiconductor materials. Non-limiting examples of semiconductor materials that semiconductor nanocrystal core can comprise include, but are not limited to, ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, InSb (III-V materials), CuInGaS$_2$, CuInGASe$_2$, AgInS$_2$, AgInSe$_2$, and AuGaTe$_2$ (I-III-VI materials). In addition to binary and ternary semiconductors, semiconductor nanocrystal core may comprise quaternary or quintary semiconductor materials. Non-limiting examples of quaternary or quintary semiconductor materials include $A_xB_yC_zD_wE_{2v}$, wherein A and/or B may comprise a group I and/or VII element, and C and D may comprise a group III, II and/or V element although C and D cannot both be group V elements, and E may comprise a VI element, and x, y, z, w, and v are molar fractions between 0 and 1.

One or more metals may be formed or deposited on the outer surface of a semiconductor nanocrystal core (referred to herein as a "metal layer") after formation of the core to form a nanocrystal. The metal layer is a layer of metal atoms non-bonded with each other and may act to passivate the outer surface of the semiconductor nanocrystal core and limit the diffusion rate of oxygen molecules to the semiconductor nanocrystal core. The metal layer may be formed on the outer surface after synthesis of the semiconductor nanocrystal core (as opposed to being formed concurrently during synthesis of the core. The metal layer is typically between 0.1 nm and 5 nm thick, and may include any number, type, combination, and arrangement of metals. For example, the metal layer may be simply a monolayer of metals formed on the outer surface of the core or multiple layers of metals formed on the outer surface. The metal layer also may include different types of metals arranged, for example, in alternating fashion. Further, the metal layer may encapsulate the semiconductor nanocrystal core or may be formed on only parts of the outer surface of the core. The metal layer may include the metal from which the semiconductor nanocrystal core is made either alone or in addition to another metal. Non-limiting examples of metals that may be used as part of metal layer 20 include Cd, Zn, Hg, Pb, Al, Ga, or In.

The semiconductor nanocrystal core and the metal layer may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as Trioctylphosphine oxide (TOPO), Trioctylphosphine (TOP), Tributylphosphine (TBP), Hexadecyl amine (HDA), Dodecanethiol, and Tetradecyl phosphonic acid (TDPA).

The nanocrystal further may include a shell overcoating the metal layer. The shell may comprise a semiconductor material having a bulk bandgap greater than that of the core. In such an embodiment, the metal layer may act to passivate the outer surface of the core as well as prevent or decrease lattice mismatch between the core and the shell.

The shell may be grown around the metal layer, and is typically between 0.1 nm and 10 nm thick. The shell may provide for a type A semiconductor nanocrystal. The shell may comprise various different semiconductor materials such as, for example, CdSe, CdS, CdTe, ZnS, ZnSe, ZnTe, HgS, HgSe, HgTe, InP, InAs, InSb, InN, GaN, GaP, GaAs, GaSb, PbSe, PbS, PbTe, CuInGaS$_2$, CuInGaSe$_2$, AgInS$_2$, AgInSe$_2$, AuGaTe$_2$, ZnCuInS$_2$.

One example of a shell material that may be used to passivate the outer surface of a semiconductor nanocrystal core is ZnS. The presence of a metal layer may provide for a more complete and uniform shell without the amount of defects that would be present with a greater lattice mismatch. Such a result may improve the quantum yield of the resulting nanocrystal.

The semiconductor nanocrystal core, metal layer, and shell may be grown by the pyrolysis of organometallic precursors in a chelating ligand solution or by an exchange reaction using the prerequisite salts in a chelating ligand solution. The chelating ligands are typically lyophilic and have an affinity moiety for the shell and another moiety with an affinity toward the solvent, which is usually hydrophobic. Typical examples of chelating ligands include lyophilic surfactant molecules such as Trioctylphosphine oxide (TOPO), Trioctylphosphine (TOP), Tributylphosphine (TBP), Hexadecyl amine (HDA), Dodecanethiol, and Tetradecyl phosphonic acid (TDPA).

A nanocrystal may comprising a semiconductor nanocrystal core having an outer surface, as described above, and a shell, as described above, formed on the outer surface of the core. The shell may encapsulate the semiconductor nanocrystal core or may be formed on only parts of the outer surface of the semiconductor nanocrystal core.

Each population of nanocrystals disposed within the active layer may absorb a portion of the light emitted by the underlying light source and emit light at a longer wavelength, where the peak emission wavelength of each quantum dot population is dependent upon the composition and mean diameters of the quantum dots themselves. Thus, the active layer 40 may absorb the emission of light by the light source 20 and, typically, emit light at a wavelength different from the light source 20. Each population of nanocrystals may include a plurality of similar quantum dots in both composition and size. The active layer 40 may comprise one or more semiconductor nanocrystals and/or a powdered phosphor placed in matrix material. Typical matrix materials into which semiconductor nanocrystals may be incorporated in the active layer include UV or thermally cured polyurethane acrylates, OP-54, butyl acetate, epoxy, xylol, and silicone. Nanoscale or microscale particles, such as titania, may be added to the active layer to add a degree of optical scattering, such as to induce angular color uniformity (the light emitted from the nanocrystal and the underlying source may emit at different angular intensities without the addition of scatterers that would otherwise result in a perceived variation of color at different viewing angles).

Although FIG. 1 shows the active layer 40 as a single layer, it may comprise more than one layer of semiconductor nanocrystals and/or powdered phosphors. Additionally, although the figures show an encapsulant layer 30 between the active layer 40 and the light source 20, the devices may be constructed without the first encapsulant layer 30. The active layer, therefore, may be disposed directly on the underlying light source, or there may be one or more intervening layers between the active layer and the light source.

With respect to the first encapsulant layer 30, this layer may comprises a matrix material, non-limiting examples of which are silicones, epoxies, acrylates, plastics and combinations thereof including a polyacrylate, an acrylated silicone, polyurethane acrylate, epoxy, silicone, sol-gel, nanoclay, or a combination thereof. The encapsulant layer 30 may space apart the active layer from the light source 20 and prevent excessive heat generated by the light source 20 from reaching the population of semiconductor nanocrystals, which otherwise could cause heat degradation. The matrix material can be deposited on the light source and then cured by, for example, ultraviolet (UV) or thermal curing, solvent evaporation, or some other chemical reaction, such as a Michael reaction.

Nanocrystals tend to be sensitive to oxidation which may reduce quantum yield and shift the emission wavelength to shorter wavelengths. A second encapsulent layer 50 may be deposited onto the active layer 40 to reduce oxygen permeability thereby reducing the exposure of the nanocrystals in the active layer to oxidation. The second encapsulant layer 50 may comprises a matrix material which can include the same non-limiting examples as described above with respect to the encapsulant layer 30. Further non-limiting examples of materials used in the second encapsulent layer include OP-54, PVDC, PVoH, Sancure 777. In addition, nanoclays may be incorporated into an encapsulent layer to limit oxygen diffusion. It is may be preferred for curing of the first encapsulent layer, active layer and second encapsulent layer occur in an atmosphere substantially devoid of oxygen either through a vacuum or purging with an inert gas.

Although FIG. 1 illustrates the deposit of both encapsulant layers 30, 50, it is understood that only encapsulant layer 30 or only encapsulant layer 50 may be employed. Further, although encapsulant layers 30, 50 are shown as single layers, either or both can be applied as more than one layer. Further, other layers can be disposed between or one any of the active layer, encapsulant layer 30, and/or encapsulant layer 50. It may be preferred that curing of the first encapsulent layer, the active layer and the second encapsulent layer occur in an atmosphere substantially devoid of oxygen either through a vacuum or purging with an inert gas.

Regarding light source 20, this source may be an LED chip. Different LED chips may produce distinct colors. The actual ratio of constituent elements which compose the semiconductor dictates the ensuring bandgap and thus determines the emission wavelength of the LED chip. For example, AlInGaP may be used to create high-brightness LEDs having peak wavelengths ranging from orange through deep red, and InGaN may be used for LEDs that emit light having a peak wavelength of green, blue, violet, or ultraviolet. Additionally, the LED chip may emit light at an energy that is capable of exciting the semiconductor nanocrystals present in the active layer 40. Typically, semiconductor nanocrystals may be excited by wavelengths that are less than the emission wavelengths of the semiconductor nanocrystal.

As a specific example, the light emitted from an InGaN LED chip in an embodiment of the invention may be between 440 nm to 480 nm, more preferably between 450 nm and 470 nm, and more preferably at about 460 nm. Unlike traditional phosphors, semiconductor nanocrystals have a broadband absorption spectra and can therefore be excited by any light source having a shorter wavelength than the peak emission wavelength of the nanocrystals. LED chips other than "blue" LEDs may be used such as violet and UV emitting chips, which emit light of about 405-410 nm and 380-390 nm, respectively. It is also appreciated that even shorter wavelength lights sources and solid state light sources may be used.

Further details regarding the manufacture and use of nanocrystals and devices are provided in U.S. application Ser. No. 11/485,335, filed Jul. 13, 2006, U.S. application Ser. No. 11/747,701, filed May 11, 2007, and U.S. application Ser. No. 11/680,047, filed Feb. 28, 2007, the disclosure of each of which is incorporated by reference in its entirety.

It has been found that light of a desired color, such as light having specific, pre-selected CIE coordinates, may be generated by including one or more populations of semiconductor nanocrystals in the active layer of devices according to embodiments of the invention. For example, various white lights may be created by depositing green-yellow and orange-red emitting nanocrystals in an active layer disposed over a blue LED chip. The power spectral distribution of devices described herein may have emission peaks in specific ratios resulting from the ratios of nanocrystals present in the active layer.

For example, white-emitting devices can be made by incorporating one or more populations of semiconductor nanocrystals into the active layer at a concentration such that the combination of the emission from the underlying blue LED chip (typically about 450 nm-470 nm peak emission) plus the light emitted from the nanocrystals falls on or around the Plankian locus. Several white-emitting devices have been produced by utilizing single populations of nanocrystals having a peak emission wavelength between about 520 nm to 580 nm to achieve a white color temperatures between about 12000K and 4000K.

Although a single nanocrystal population may be used with a blue underlying LED chip to create white, the color quality may be poor or unacceptable. That is, the emitted light may have an undesirably or unacceptably low CRI. White light having greater color quality can be achieved by mixing two or more populations of nanocrystals in the active region, where each population of nanocrystals can absorb a portion of the light emitted by the underlying LED chip at the first wavelength and emit light at different peak wavelengths. The underlying LED chip may be, for example, a blue LED that emits light of about 450 nm-470 nm. It is understood that to achieve white, it is desirable that the concentrations of each population of nanocrystals plus the underlying LED chip translate to an emission spectrum that correspond to color coordinates on the Planckian locus. It is also recognized that any "red" (i.e. wavelengths between about 600 nm and 700 nm) and "green" (wavelengths between about 500 nm and 600 nm) emission from nanocrystals can be added together to an underlying blue LED chip to create white emitted light. However, because the human eye is more sensitive to "green" light than both longer-wavelength "red" light and shorter-wavelength "blue" light (the peak of the human-eye photopic sensitivity curve is at about 555 nm), light emitted from the two or more nanocrystal populations having wavelengths closer to 555 nm may yield a greater luminous efficacy. In particular, it has been found that white light having an optimized luminous efficacy and CRI greater than 86 can be achieved by combining two nanocrystal populations (1 "green" and 1 "red") on a "blue" (about 460 nm) LED chip at concentrations that result in peak emission wavelengths between about 540 nm and 555 nm ("green") and between about 600 nm and 615 nm ("red"). Because nanocrystals have an absorption spectrum that overlaps the short wavelength side of the nanocrystal emission, the peak emission wavelength tends to red shift at high concentrations. Thus, to achieve an output spectrum having emission peaks at about 540 nm-555 nm and 600-615 nm respectively, nanocrystals having a somewhat shorter peak emission wavelengths may be used. It may be preferred for nanocrystal emission wavelengths to be approximately 535 nm for "green" and 605 nm for "red".

By varying the relative concentrations of these two wavelengths, white light having a color temperature between about 12000 k and 2700K can be achieved. Luminous efficacy is dependent upon the quantum yield as well as the peak emission wavelengths and spectral bandwidth. Luminous efficacies between 72% and 125% of YAG:Ce phosphor deposited on the same underlying "blue" LED chip can be achieved when the nanocrystal peak emission wavelengths are utilized as described herein.

Figure 2A:
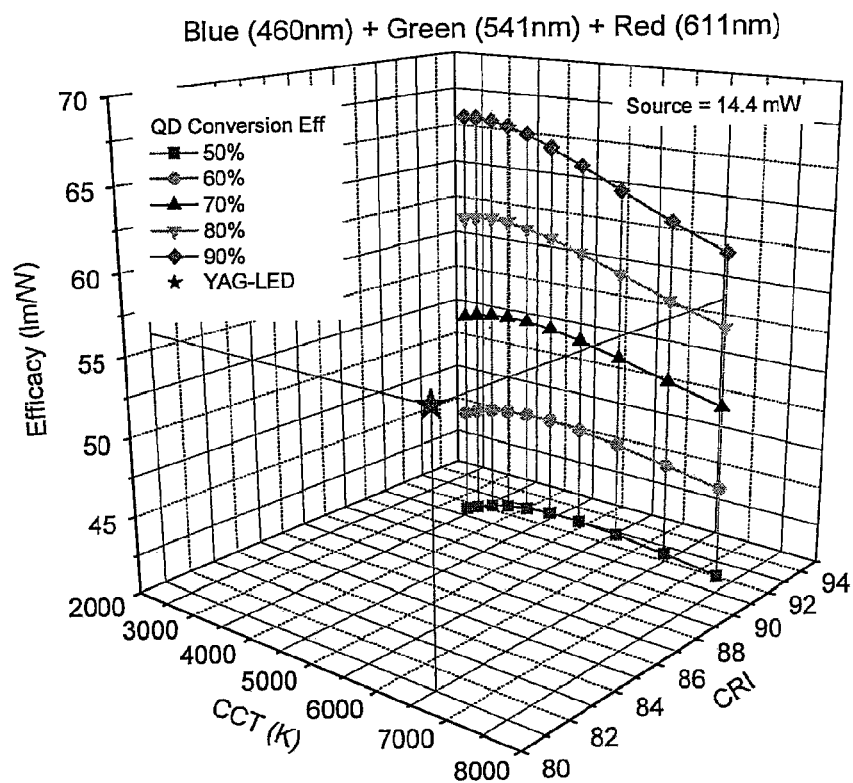
FIG. 2A shows a comparison of a conventional YAG-based LED to devices made with semiconductor nanocrystals.

Two comparisons of a conventional YAG-based LED device with devices made according to embodiments of the present invention have been performed. FIG. 2A shows a comparison of a conventional YAG-based LED to devices made with semiconductor nanocrystals emitting at 541 nm and 611 nm in the active layer of the device. As can be seen from the graph, when placed on a 14.4 mW source emitting at 460 nm the CRI of the devices made with the semiconductor nanocrystals vary between 91 and 93 which is significantly greater than the CRI for the YAG-based LED. Additionally, using the semiconductor nanocrystals, color temperatures of about 3,000 K to 7,500 K may be achieved. Further, depending on the conversion efficiency of the active layer, efficacies of between about 40 and 68 lm/W may be reached.

Figure 2B:
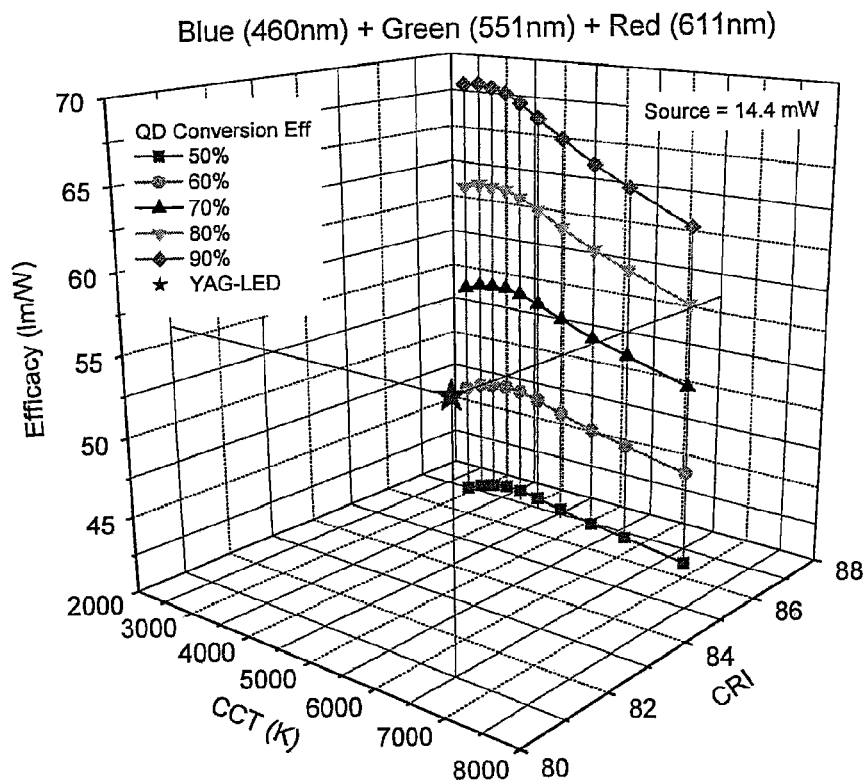
FIG. 2B shows a comparison of a conventional YAG-based LED to devices made with semiconductor nanocrystals.

FIG. 2B compares a conventional YAG-based LED to devices made with semiconductor nanocrystals emitting at 551 nm and 611 nm in the active layer of the device. As can be seen from the graph, when placed on a 14.4 mW source emitting at 460 nm the CRI of the devices made with the semiconductor nanocrystals vary between 86 and 88 which is significantly greater than the CRI for the conventional YAG-based LED. Additionally, using the semiconductor nanocrystals, color temperatures of about 3,000 K to 7,000 K may be achieved. Furthermore, depending on the conversion efficiency of the active layer, efficacies of between 40 and 68 lm/W may be reached.

As another example, infrared (IR) devices can be produced by depositing one or more populations of photoluminescent infrared emitting nanocrystals onto an underlying LED chip in a similar manner as that used to make white and specialty color visible devices. The nanocrystals used to make IR devices generally should emit light at wavelengths between about 680 nm and 5000 nm when illuminated by an underlying light source having a shorter wavelength than the nanocrystal emission. The nanocrystals absorb a portion of the light emitted by the underlying light source and reemit at a longer infrared wavelength(s). Nonlimiting examples of underlying light sources include InGaN UV, Violet Blue and Green LEDs, AlGaP AlInGaP Green amber orange, and red LEDs. Underlying infrared LEDs also may be used to excite the overlying infrared emitting nanocrystals. More generally, any underlying source may be used that emits at a first wavelength that is shorter than the second wavelength emitted by the nanocrystals. Nonlimiting examples of infrared emitting nanocrystals include, Lead Sulfide (PbS) nanocrystals, Copper Indium Gallium Selenide (CIGSe) and Copper Indium Gallium Sulfide (CIGS), InP and InGaP nanocrystals, and InSb. It is generally known that organic materials absorb at specific wavelengths within the infrared portion of the spectrum particularly at longer wavelength infrared. Therefore, if the infrared-emitting nanocrystals are dispersed within a matrix material over the underlying LED chip, it may be preferred for the encapsulent to be substantially transparent to the nanocrystal emission wavelength. Nonlimiting examples of suitable matrix materials include OP-54 (for short wavelength infrared) and silica sol-gel.

Exemplary combinations of active layer nanocrystal population ratios and the resulting color output when combined with a blue (about 450 nm-480 nm) LED chip are shown in the table below. The specific values provided are non-limiting and other combinations and colors are possible. The relative nanocrystal population concentration, emissive power spectral distribution ratio(s), CCT, CRT, and approximate CIE coordinates are shown where applicable.

The specific wavelengths and color coordinates described herein are exemplary, and it will be understood that embodiments may include variations in the emitted wavelengths and resulting color coordinates. Specifically, various embodiments of the invention may include emission peak wavelengths that vary by about ±5 nm from those described herein. Thus, for example, an orange-red emmission peak described as occurring at 606 nm also may occur anywhere in the range of about 601 nm-611 nm. As another specific example, a source described as emitting light at a wavelength of 530 nm may emit light anywhere in the range of about 525 nm-535 nm.

| Color | Underlying Source | Relative Nanocrystal Pop. | Distr. Ratio |
|---|---|---|---|
| White (6100 K, 88 CRI) | 460 nm | 10 mg/mL yellow: 1.3 mg/mL red | |
| Cool White (10,800-13,700 K) | 460 nm | 3.57 mg/mL 536 nm: .336 mg/mL 601 nm | 7:3:2 blue:green:orange |
| Daylight White (4400-6400 K, 92-96 CRI) | 460 nm | 3.57 mg/mL 520 nm: .336 mg/mL 606 nm | 4:3:3 blue:green:red |
| Warm White (2800 K, 88 CRI) | 450 nm | .798 mg/mL 536 nm: 1.527 mg/mL 601 nm | 1:2:3 blue:green:orange |
| Green (0.30 ± .05, 0.50 ± .05) | 460 nm | 20 mg/mL green (536 nm) | 1:0.25 green:blue |
| Purple (0.35 ± .05, 0.15 ± .05) | 460 nm | 20 mg/mL red (630 nm) | 1:1.2 red:blue |
| Pearl White (0.33 ± .05, 0.36 ± .05) | 470 nm | 530 nm, 606 nm @ 9:1 | 3:6:5 blue:green:orange |
| Deep Purple (0.22 ± .05, 0.10 ± .05) | 470 nm | 0.67 mg/mL 612 nm | 3.5:1 blue:red |
| Pink (0.44 ± .05, 0.02 ± .05) | 470 nm | 2.15 mg/mL 612 nm | 1:1.7 blue:red |
| Lime (0.29 ± .05, 0.59 ± .05) | 470 nm | 530 nm, 606 nm @ 60:1 | 1:7:1 blue:green:orange |
| Peach (0.43 ± .05, 0.27 ± .05) | 470 nm | 567 nm, 606 nm @ 2:1 | 1:2:4 blue:yellow:orange |
| Aqua (0.22 ± .05, 0.38 ± .05) | 470 nm | 6.25 mg/mL 530 nm | 3:4 blue:green |
| Ice White (0.27 ± .05, 0.29 ± .05) | 470 nm | 530 nm, 606 nm @ 2:1 | 8:6:5 blue:green:orange |

In embodiments of the invention, multiple individual LEDs may be used to achieve white light or a desired spectral emission. For example, multiple devices such as that illustrated in FIG. 1 may be arranged in an array or other system. Similarly, multiple underlying LED chips may be incorporated into a single device. By adjusting the ratios of the underlying light sources and/or phosphors disposed on or within overlying active layers, a specific desired emission spectrum may be achieved.

Figure 15:
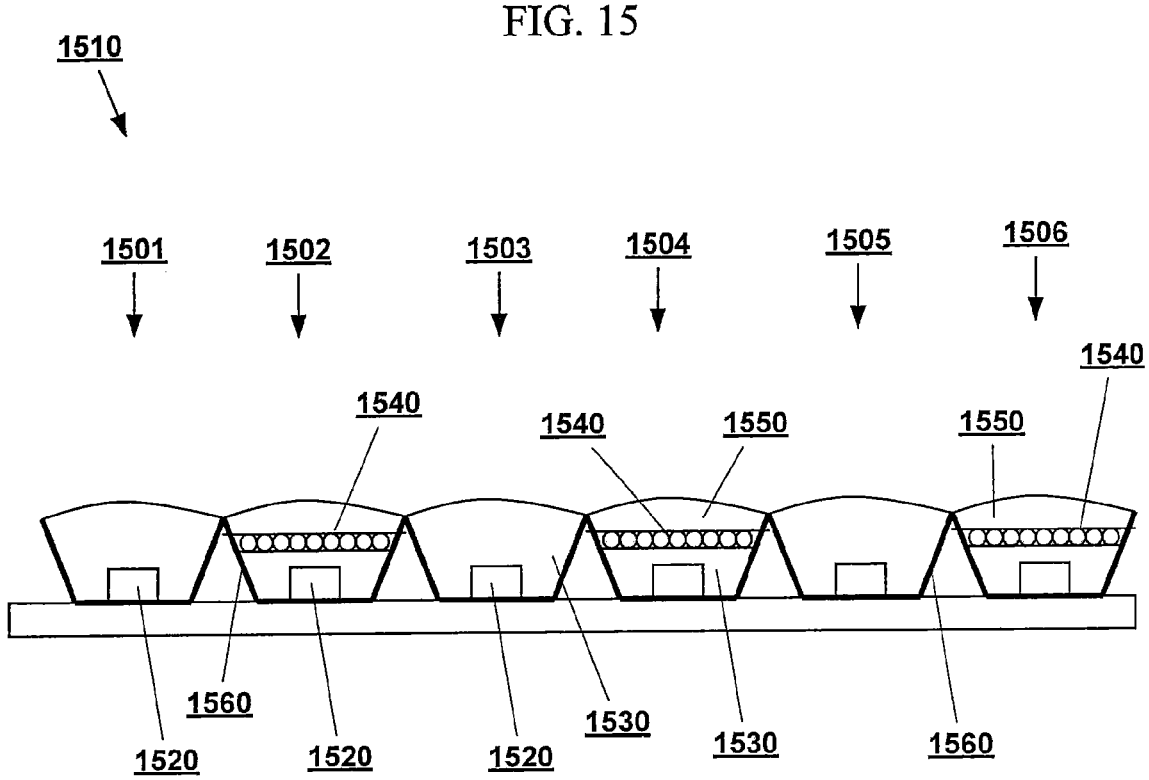
FIG. 15 shows an exemplary multi-chip light-emitting device according to an embodiment of the invention.

FIG. 15 shows a schematic view of a solid-state lighting device according to an embodiment of the invention. Each chip structure 1501-1506 may have the same structure and incorporate the same materials, layers, and structures as previously described with respect to FIG. 1. The color emitted by the device 1510 may be defined by the specific combination of colors emitted by the chip structures 1501-1506. For example, a white light emitting multi-chip array may include closely spaced "red" and short wavelength emitting LED chips, where the short wavelength LED chips are further coated with one or more photoluminescent phosphors. Non-limiting examples of short wavelength emitting LEDs chips include "blue" (about 450 nm-470 nm peak emission wavelength), "violet" (about 400 nm-410 nm peak emission wavelength), and ultraviolet (about 360 nm-390 nm peak emission wavelength) InGaN or GaN LEDs.

It may be preferred that the short wavelength LED chip(s) are InGaN "blue" LEDs and the photoluminescent phosphor includes "green" emitting semiconductor nanocrystals. The semiconductor nanocrystals absorb a portion of the first short wavelength "blue" light emitted by the underlying "blue" LED chip and reemit at a second longer "green" wavelength. The semiconductor nanocrystals may be located in an active layer deposited onto a first encapsulent layer, which in turn may be deposited on or above the blue LED chip itself. The combination of the blue LED chip with green emitting semiconductor nanocrystals and the red LEDs may create a white color.

It may be preferred for the "blue" LED chip to emit light at an energy that is capable of exciting the semiconductor nanocrystals present in the active layer (1540). Typically, semiconductor nanocrystal complexes may be excited by wavelengths that are less than the emission wavelengths of the semiconductor nanocrystal.

In an exemplary multichip device (1510) the blue LED chips may be coated with "green" emitting semiconductor nanocrystals where the "red" LEDs may or may not also be coated with semiconductor nanocrystals. It is appreciated that the semiconductor nanocrystals are substantially transparent to the light emitted by the "red" LED. The semiconductor nanocrystal coating over the blue LED chip may include a first encapsulant layer (1530), an active layer (1540), a second encapsulant layer (1550), and a housing (60). A similar coating may be disposed over "red" LED chips. The "red" and "blue" LEDs in the multichip array may be driven independently, allowing for some degree of color tenability.

In an embodiment of the invention, the "red" emitting LEDs in the multi-chip array may emit light having a peak wavelength between about 580 nm and 680 nm, more preferably between about 590 nm and 620 nm, and more preferably at about 605 nm. The "blue" LEDs chips also comprising the multi-chip array may emit light having a peak wavelength between 440 nm to 480 nm, more preferably between 450 nm and 470 nm and more preferably at about 460 nm. LED chips other than "blue" LEDs may be used, such as violet and UV emitting chips (about 405-410 nm and 380-390 nm, respectively). Shorter wavelength sources and solid state sources also may be used. The first encapsulant layer or layers (1530) may space apart the active layer from the LED chip (1520). As previously described, it has been found that this may increase the lifespan of the resulting device by reducing the exposure of the semiconductor nanocrystals to the excess temperatures generated by the underlying LED chip.

The active layer or layers (1540) may absorb a portion of the light emitted by the underlying LED chip or chips (1520) and emit light at a wavelength different from the LED chip (1520). The active layer (1540) may include one or more populations of the semiconductor nanocrystal complexes. For example, each population may absorb a portion of the light emitted by a "blue" LED chip and reemit at one or more peak wavelengths in the "green" portion of the visible spectrum. Although in many configurations only one nanocrystal population emitting with a single peak wavelength may be used, by adding addition nanocrystal populations emitting at slightly different wavelengths, a higher color rendering index may be achieved. In embodiments of the invention, if a single nanocrystal population is used, the peak emission wavelength may be between about 500 nm and 580 nm, specifically between about 520 nm and 560 nm, and more specifically at about 555 nm. If two or more populations of nanocrystals are incorporated into the active layer, the peak emission wavelength of each population of nanocrystals may be between about 500 nm and 580 nm.

Phosphor materials other than semiconductor nanocrystals may be used in embodiments of the invention. Non-limiting examples of phosphor that may be used to coat "blue", "violet" or "UV" LEDs include YAG:Ce, TAG:Ce, green Nitride, green orthosilicate, alpha-sialon etc. Furthermore, if more than one photoluminescent phosphor is used to down-convert a portion of the light from the short wavelength LED, to they may be mixed together in active region or stacked one on top of the other in multiple layers.

The active layer (1540) may include one or more population of semiconductor nanocrystals. The active layer (1540) may include more than one layer of semiconductor nanocrystals. Typical matrix materials into which semiconductor nanocrystals may be added include UV or thermally cured polyurethane acrylates, OP-54, butyl acetate, epoxy, xylol, and silicone.

The encapsulant layer 1530 may be provided to prevent excessive heat generated by the light source 20 from reaching the population of semiconductor nanocrystals in the active layer, which otherwise could cause heat degradation. The encapsulant layer 1530 may comprises a matrix material, non-limiting examples of which are silicones, epoxies, acrylates, plastics and combinations thereof including a polyacrylate, an acrylated silicone, polyurethane acrylate, epoxy, silicone, sol-gel, nanoclay, or a combination thereof. The matrix material can be deposited on the light source and then cured by, for example, ultraviolet (UV) or thermal curing, solvent evaporation, or some other chemical reaction, such as a Michael reaction.

Nanocrystals tend to be sensitive to oxidation which reduces quantum yield and shifts the emission wavelength to shorter wavelengths. A second encapsulant layer (1550) may be deposited onto or over the active layer (1540) to substantially reduce oxygen permeability thereby reducing the exposure of the nanocrystals in the active layer to oxidation. The second encapsulant layer 1550 disposed over active layer 1540 may comprises a matrix material which can include the same non-limiting examples as described above with respect to the encapsulant layer 1530. Nonlimiting examples of materials used in the second encapsulent layer include OP-54, PVDC, PVoH, Sancure 777. In addition, nanoclays may be incorporated into the second encapsulent layer to limit oxygen diffusion.

It may be preferred that curing of the first encapsulent layer, active, region, and upper encapsulent layer occur in an atmosphere substantially devoid of oxygen either through a vacuum or purging with an inert gas.

Although the figures show an encapsulant layer (1530) between the active layer (1540) and the LED chip (1520), the devices may be constructed without the first encapsulant layer (1530). Further, although FIG. 15 illustrates the deposit of both encapsulant layers 1530, 1550, it is understood that only encapsulant layer 1530 or only encapsulant layer 1550 may be employed. Further, although encapsulant layers 1530, 1550 are shown as single layers, either or both can be applied as more than one layer. Further, other layers can be disposed between or one any of the active layer, encapsulant layer 1530, and/or encapsulant layer 1550.

White light can be made by incorporating one or more populations of nanocrystals into the active layer at a concentration such that the combination of the light emitted from the underlying blue LED (about 450-470 nm peak emission) plus the second wavelength emitted from the nanocrystals, plus the light emitted from the "red" LED that comprise a multi-chip array falls on the Plankian locus. To achieve white, it may be preferred for the concentrations of each population of nanocrystals plus the underlying LED (blue or UV and red LEDs) to translate to an emission spectrum that correlates to color coordinates on the Plankian locus. Any combinations of nanocrystal emitting in the "green" portion of the spectrum (i.e., wavelengths between about 500 nm and 600 nm) can be added to an underlying Blue LED to create white. However, because the human eye is more sensitive to "green" than either longer wavelength "red" or shorter wavelength "blue," light emitted from the two or more nanocrystal populations having wavelengths closer to 555 nm may result in a greater luminous efficacy.

Because nanocrystals have an absorption spectrum that overlaps the short wavelength side of the nanocrystal emission, the peak emission wavelength may red shift at high concentrations. To achieve an output spectrum having emission peaks at about 540 nm-555 nm, nanocrystals having a somewhat shorter peak emission wavelengths may be used in a multi-chip array. An exemplary nanocrystal emission wavelength is about 535 nm for "green" light.

EXAMPLES

Specific representative examples will now be described, including how such examples were prepared. It is understood that the specific methods, materials, conditions, process parameters, apparatus and the like are non-limiting.

Various Active Layer Locations on the LED

Devices according to embodiments of the present invention may be fabricated on low power SMD-type LEDs, such as those available commercially from Cree, Optosupply, and Knowledge-On Inc.). To place a semiconductor nanocrystal layer in various locations, different volumes of matrix for a first encapsulant layer were deposited on blue light emitting LEDs. Three test devices were prepared with volumes for the first encapsulant layer of 0, 1.4, and 2.1 µL for devices 1, 2, and 3, respectively. Each 1 µL can make thickness in the range of 0.1-1 mm, which is dependant on the LED size, type and form factors. The Knowledge-On LED has the form factors with 2.4 mm in diameter and about 1 mm in depth, and surrounded by a white plastic cup. In the example light-emitting devices OP-54 was used for the first encapsulant layer (30). After the depositing of the first encapsulant layer (30) it can cured under UV radiation to make solid film.

To prepare the active layer, red light emitting CdSe semiconductor nanocrystal complexes were dispersed in the matrix, OP-54, with a semiconductor nanocrystal complex concentration of 1 mg/mL. The same amount 0.7 µL of OP-54 containing CdSe semiconductor nanocrystal complexes were delivered for all three devices on the active layer (40), and the active layer (40) was cured under UV exposure. On the second encapsulant layer (50), the volume 12 μL of OP-54 is delivered to all devices forming a dome shape, and cured under UV radiation.

Figure 3:
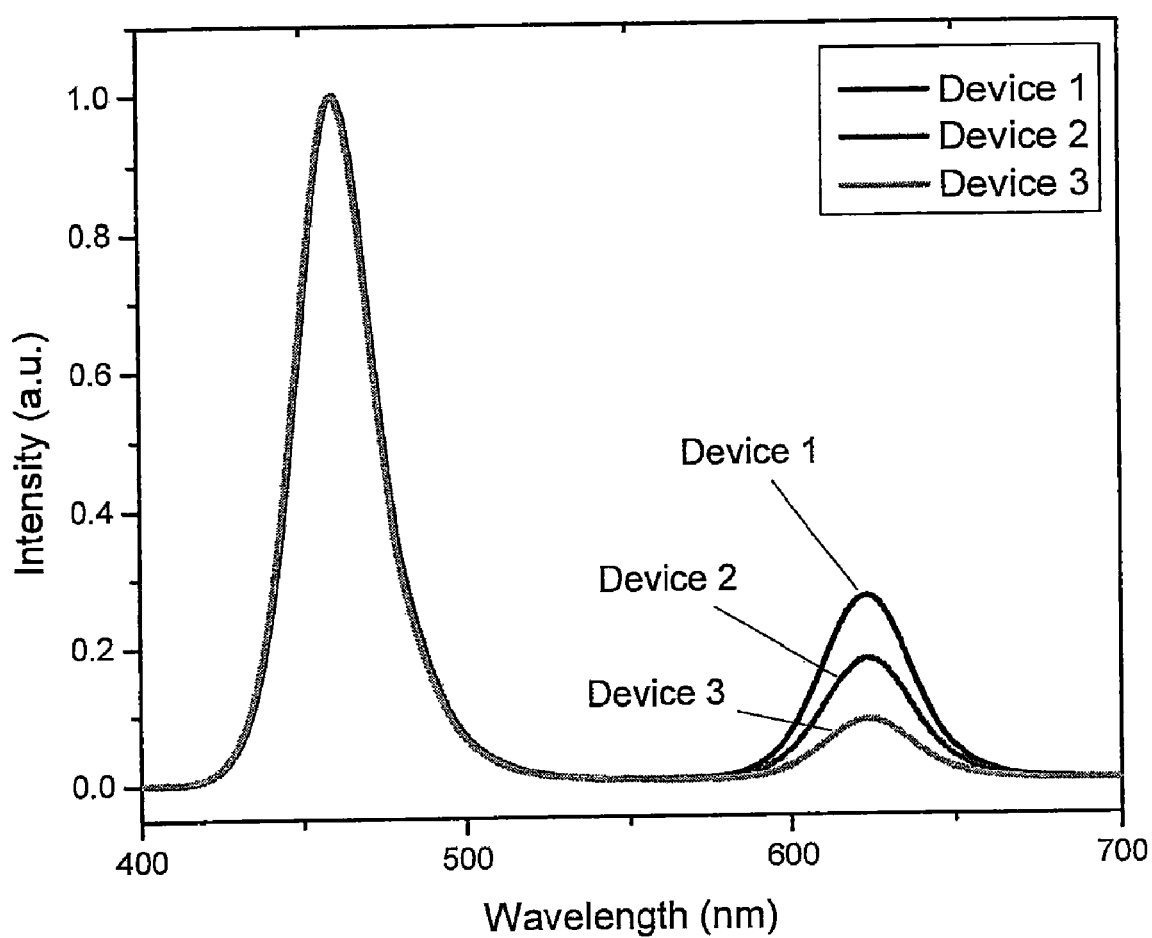
FIG. 3 shows device test results for semiconductor nanocrystal phosphor positions defined by the delivered matrix volume of an encapsulant layer.

FIG. 3 illustrates the device test results for three different semiconductor nanocrystal phosphor positions defined by the delivered matrix volume of the first encapsulant layer (30). All devices were operated at 20 mA with voltage about 3.2V. The emission peak around 460 nm is coming from LED excitation source, and spectral band around 625 nm is the semiconductor nanocrystal emission. It was found that the relative intensity decreased with increased active layer distance from LED chip. It is believed that the active layer (40) absorbs more source photons when the layer is close to excitation source.

White Color Emission with Blue LED

A white LED was fabricated as shown in FIG. 1. In this example, the UV curable resin OP-54 was used for the first encapsulant layer and the second encapsulant layer. For the layer active layer 40, two CdSe semiconductor nanocrystal complexes, yellow and red light-emitting semiconductor nanocrystals, were mixed in toluene solvent with concentrations of 10 mg/mL for yellow and 1.3 mg/mL for red light-emitting semiconductor nanocrystal complex. The 0.45 μL of semiconductor nanocrystal solution in toluene was directly delivered on the first encapsulant layer without solvating the nanocrystals in a matrix. After deposition of the active layer, the device was dried in a vacuum oven to evaporate the organic solvent. The drying time was about 1 hour at 70 Celsius. Finally, the second encapsulant layer was formed and UV-cured on top of the active layer.

Figure 4:
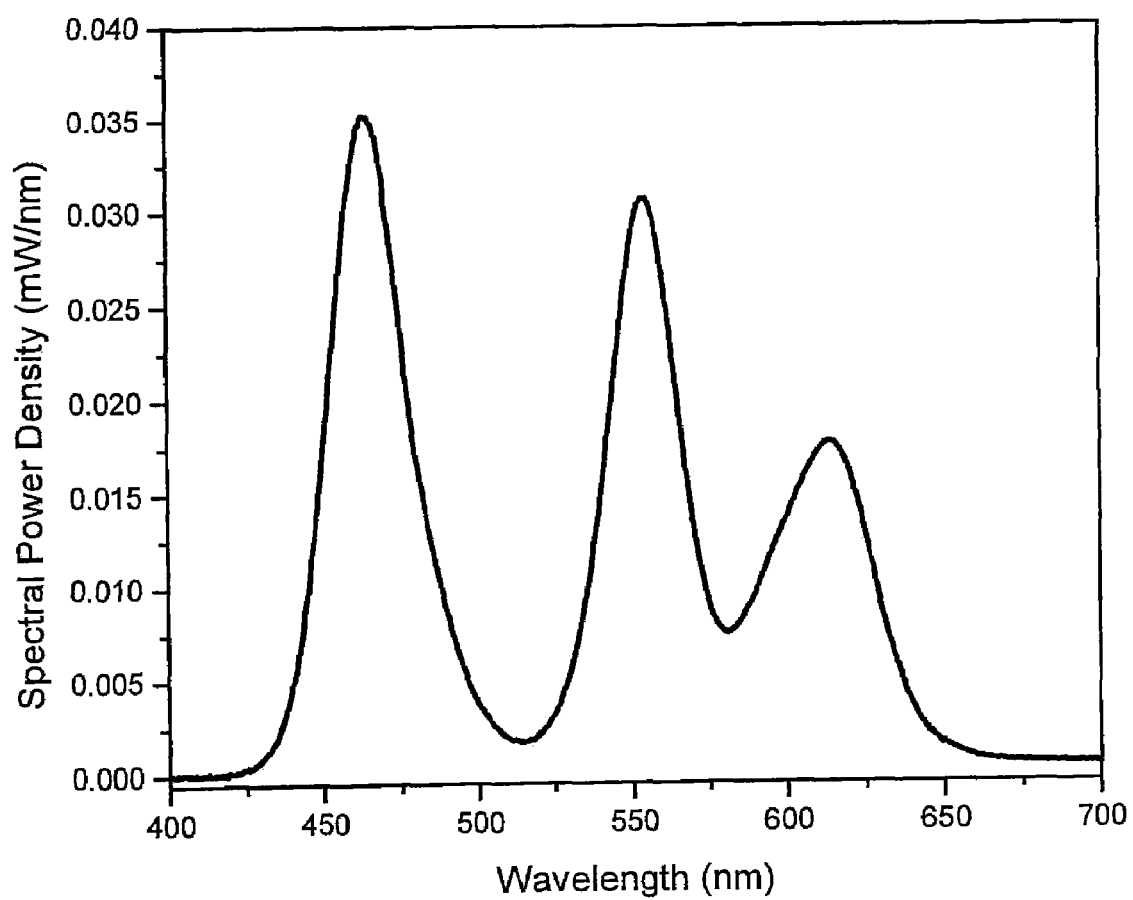
FIG. 4 shows the emission spectrum of a white light-emitting device according to an embodiment of the invention.

The white spectrum is illustrated in FIG. 4, and includes a blue source emission band at 460 nm, a yellow semiconductor nanocrystal emission band at 555 nm, and a red semiconductor nanocrystal emission band at 615 nm. The spectrum corresponds to color coordinates (0.32, 0.32) of CIE 1931. The device performances are 15 lm/W in efficacy, 47 percent in semiconductor nanocrystal conversion efficiency, 6100 K in correlated color temperature, and 88 in color rendering index.

A "cool" emitting white light was fabricated as follows. Typically, a "cool" white light is any white emitting light with a color temperature greater than about 7000 K. In particular, color temperatures greater than 10,000 K are considered cool whites. Four "cool" white LEDs were prepared as illustrated in FIG. 1. In this example, a UV curable resin OP-54, was used for the first encapsulant layer and the second encapsulant layer. It is expected that any other polyurethane acrylate may be used. For the active layer, two populations of CdSe core/shell/shell semiconductor nanocrystal complexes prepared using known techniques, a green-yellow (536 nm) and orange-red (601 nm) light-emitting semiconductor nanocrystals, were dispersed in OP-54, using known techniques, with concentrations of 3.57 mg/mL green-yellow and 0.336 mg/mL orange-red light-emitting semiconductor nanocrystal complex. The 1.0 μL of semiconductor nanocrystal solution in OP-54 was directly delivered and cured on the first encapsulant layer. Finally, the second encapsulant layer was deposited and cured on top of the active layer.

Figure 5A:
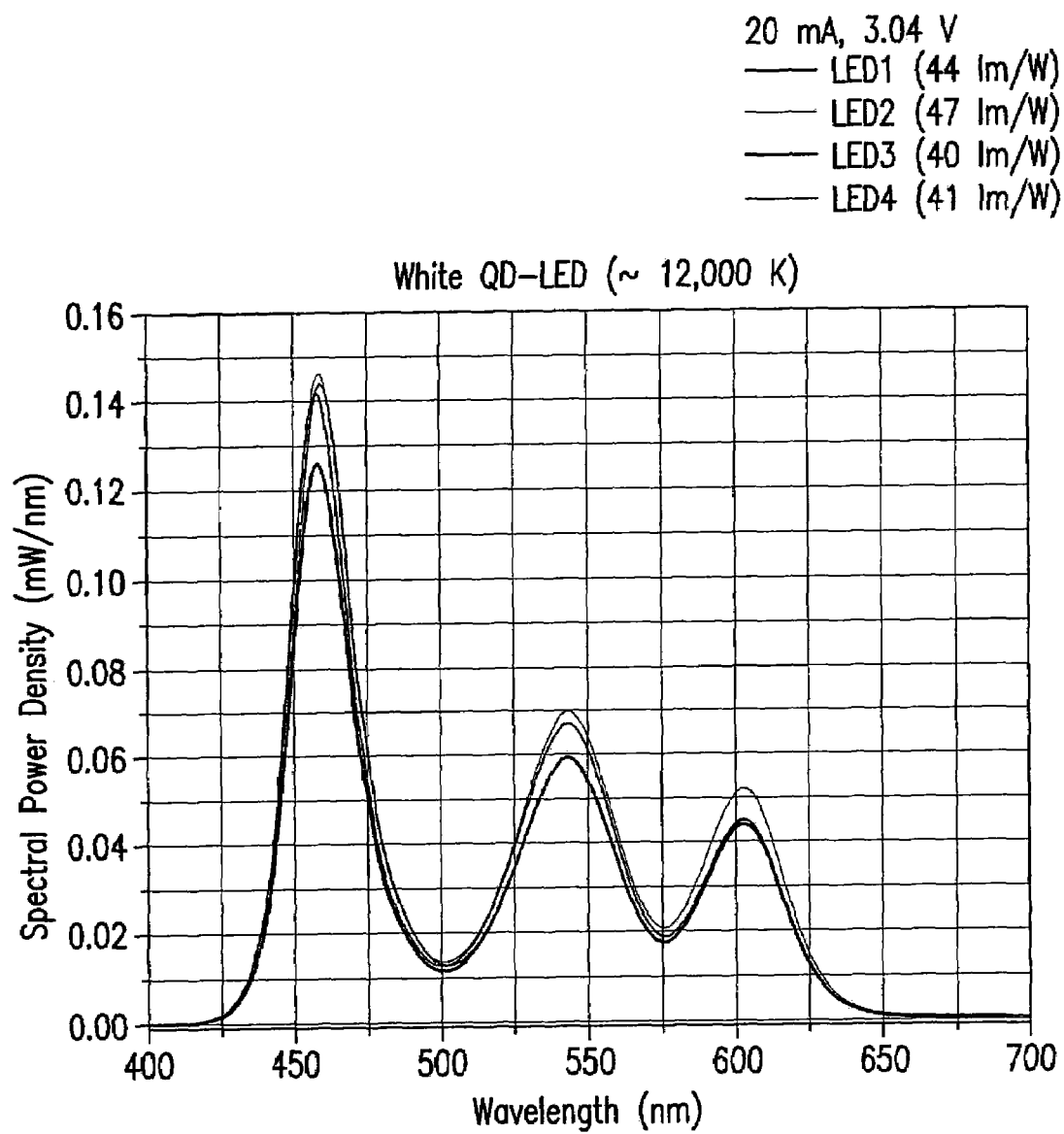
FIG. 5A shows the emission spectrum of a "cool white" light emitting device according to an embodiment of the invention.
Figure 5B:
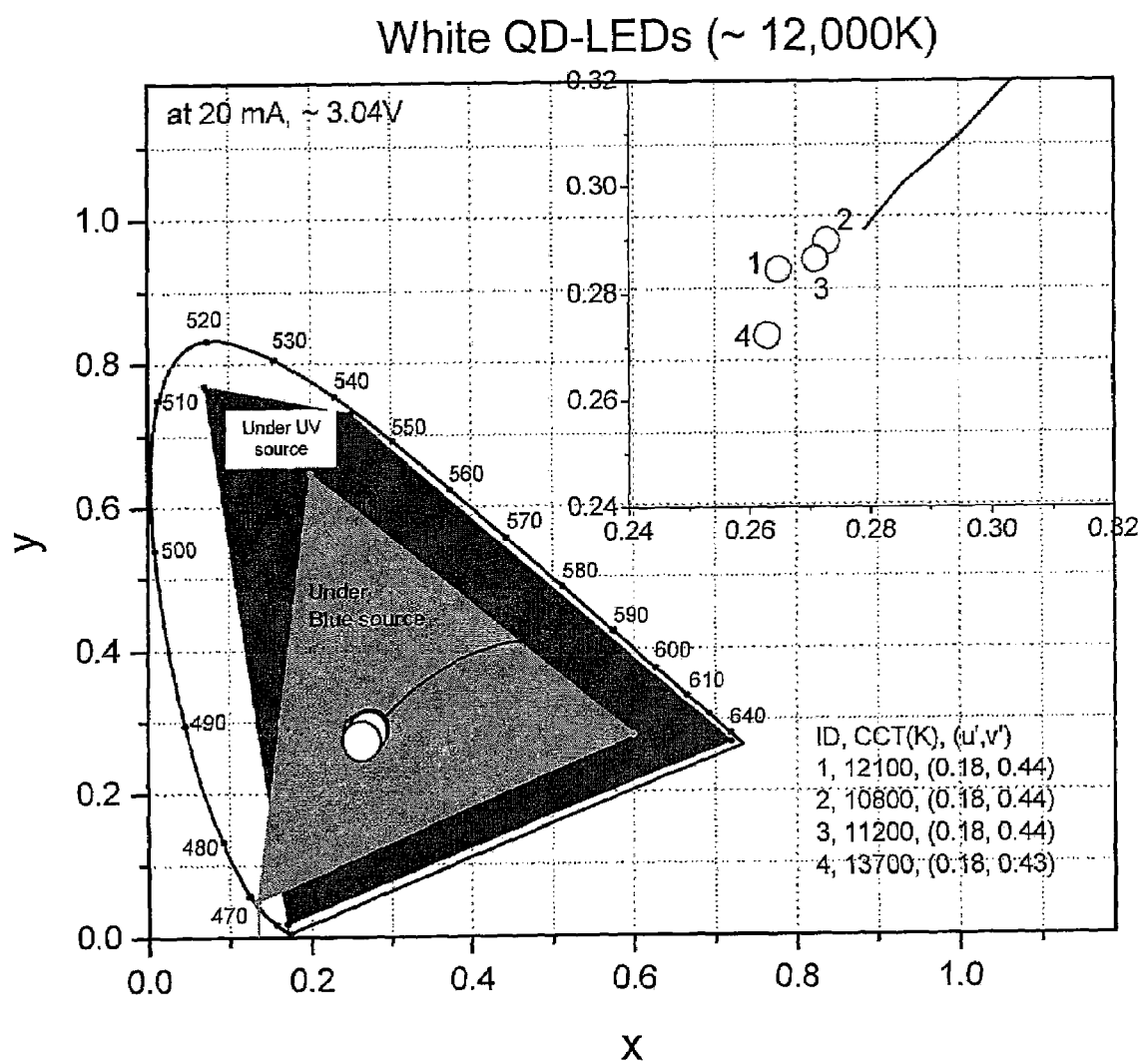
FIG. 5B shows the CIE coordinates of a "cool white" light emitting device according to an embodiment of the invention.

The white spectrum is composed of a blue source emission band at 460 nm, a yellow semiconductor nanocrystal emission band at 555 nm, and a red semiconductor nanocrystal emission band at 601 nm. For the four devices prepared as described the spectrum corresponds to color coordinates of approximately (0.265, 0.27) in CIE 1931 for each of the devices. The device performances are between 40 lm/W and 47 lm/W in efficacy, 48-52 percent in semiconductor nanocrystal conversion efficiency, and the color temperatures are between 10,800 K and 13700 K in correlated color temperature. The emission spectrum and CIE coordinates of emitted light for the devices are shown in FIGS. 5A and 5B, respectively. As can be seen from the emission spectrum diagram, semiconductor nanocrystal complexes with peaks of approximately 601 nm and 536 nm, and a blue source emitting at approximately 450 nm, may be combined such that the power spectral distribution has peaks in a ratio of approximately 1, 1.4, and 3, respectively, to create "cool" whites.

A "daylight" emitting white light was fabricated as follows. Typically, a "daylight" white light is any white emitting light with a color temperature between 4200 K and 7000 K. Four "daylight" white LEDs were prepared as shown in FIG. 1. In this example, acrylate modified silicone, zipcone, was used for the first encapsulant layer 30 and the second encapsulant layer 50. It is believed that any other composite material may be used. For the active layer 40, two populations of CdSe core/shell/shell semiconductor nanocrystal complexes were prepared using known techniques, green (520 nm) and orange-red (606 nm) light-emitting semiconductor nanocrystals were dispersed in zipcone, using known techniques, with concentrations of 3.57 mg/mL green-yellow and 0.336 mg/mL orange-red light-emitting semiconductor nanocrystal complex. The 1.0 μL of semiconductor nanocrystal solution in Zipcone was directly delivered and cured on the first encapsulant layer. Finally, the second encapsulant layer 50 was deposited and cured on top of the active layer 40. An opto-supply blue emitting LED was used as the chip for the purposes of the example LEDs made according to this embodiment.

Figure 6A:
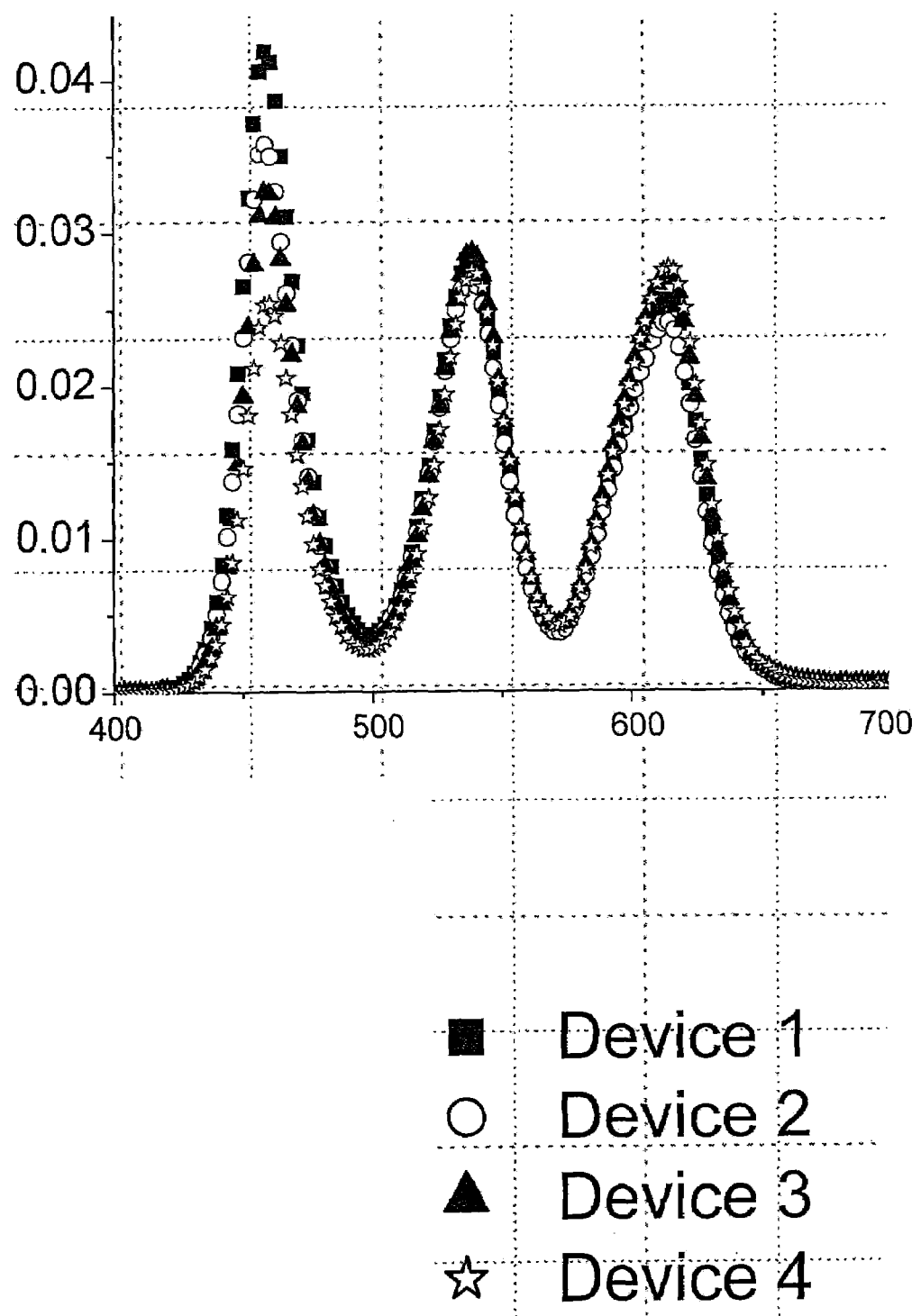
FIG. 6A shows the emission spectrum of a "daylight white" light emitting device according to an embodiment of the invention.
Figure 6B:
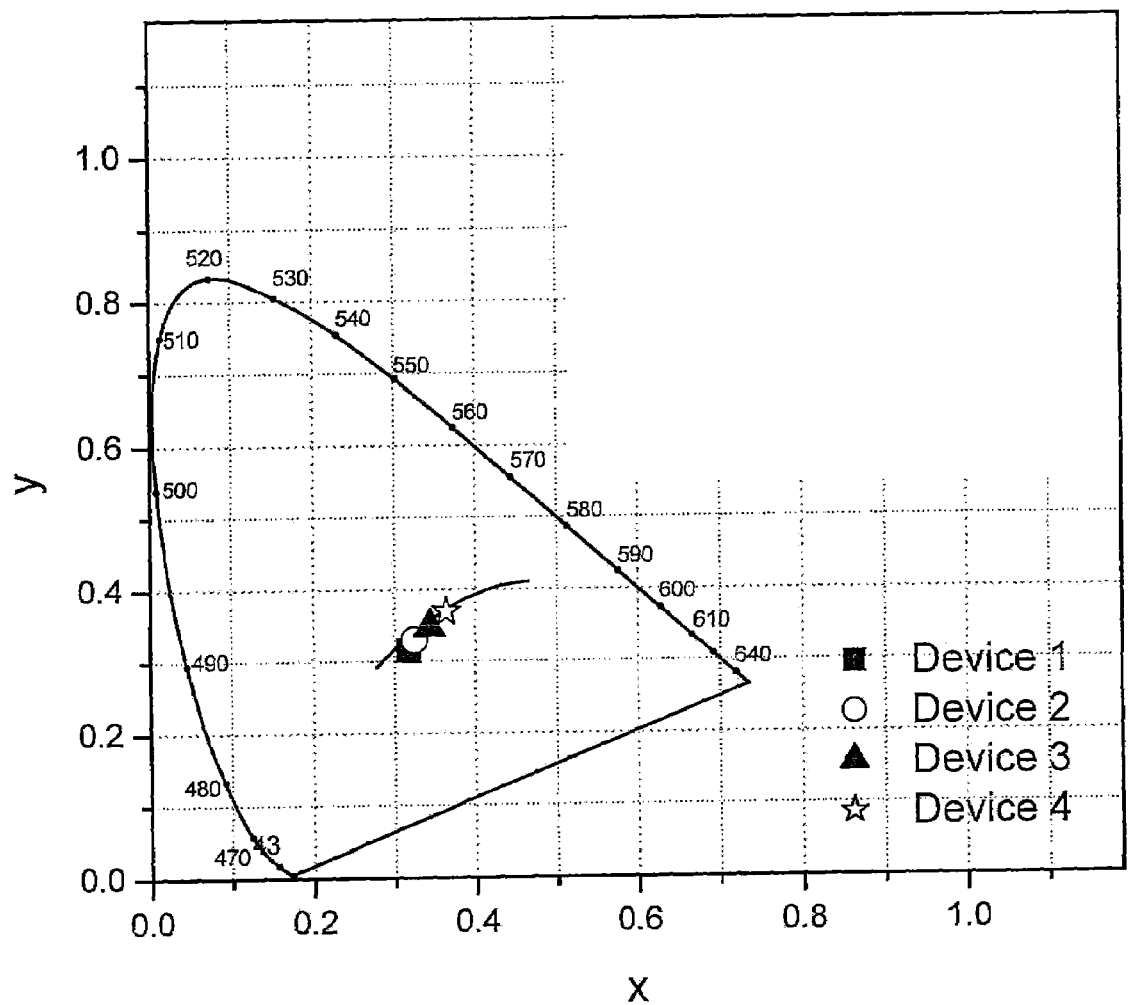
FIG. 6B shows the CIE coordinates of a "daylight white" light emitting device according to an embodiment of the invention.

The white spectrum is composed of a blue source emission band at 460 nm, a green semiconductor nanocrystal emission band at 520 nm, and a orange-red semiconductor nanocrystal emission band at 606 nm. For the four devices prepared as described the spectrum corresponds to color coordinates of approximately, 0.35, 0.35, for each of the devices of CIE 1931. The device performances are all about 16 lm/W in efficacy, 50 percent in semiconductor nanocrystal conversion efficiency, and the color temperatures are between 4400 K and 6400 K in correlated color temperature. The color rendering index for the devices were measured at between 92 CRI and 96 CRI. The emission spectrum and CIE coordinates for the devices are shown in FIGS. 6A and 6B, respectively. As can be seen from the emission spectrum diagram, semiconductor nanocrystal complexes with peaks of approximately 606 nm and 520 nm, and a blue source emitting at approximately 450 nm, may be combined such that the power spectral distribution has peaks in a ratio of approximately 1, 1, and 1.4, respectively, to create "daylight" whites.

A "warm" emitting white light was fabricated as follows. Typically, a "warm" white light is any white emitting light with a color temperature between 2500 K and 4000 K. "Warm" white LEDs as illustrated in FIG. 1 were prepared. In this example, a UV curable resin OP-54 was used for the first encapsulant layer 30 and the second encapsulant layer 50. It is believed that other polyurethane acrylates may be used. For the active layer 40, two populations of CdSe core/shell/shell semiconductor nanocrystal complexes prepared using known techniques, green-yellow (536 nm) and orange-red (601) light-emitting semiconductor nanocrystals, were dispersed in OP-54, using known techniques, with concentrations of 7.98 mg/mL green-yellow and 1.527 mg/mL orange-red light-emitting semiconductor nanocrystal complex. Next, 0.2 μL of semiconductor nanocrystal solution in OP-54 was directly delivered and cured on the first encapsulant layer. Finally, the second encapsulant layer 50 was deposited and cured on top of the active layer 40. A HP lighting smd-led with an emission of about 450 nm was used for the LED chip.

Figure 7A:
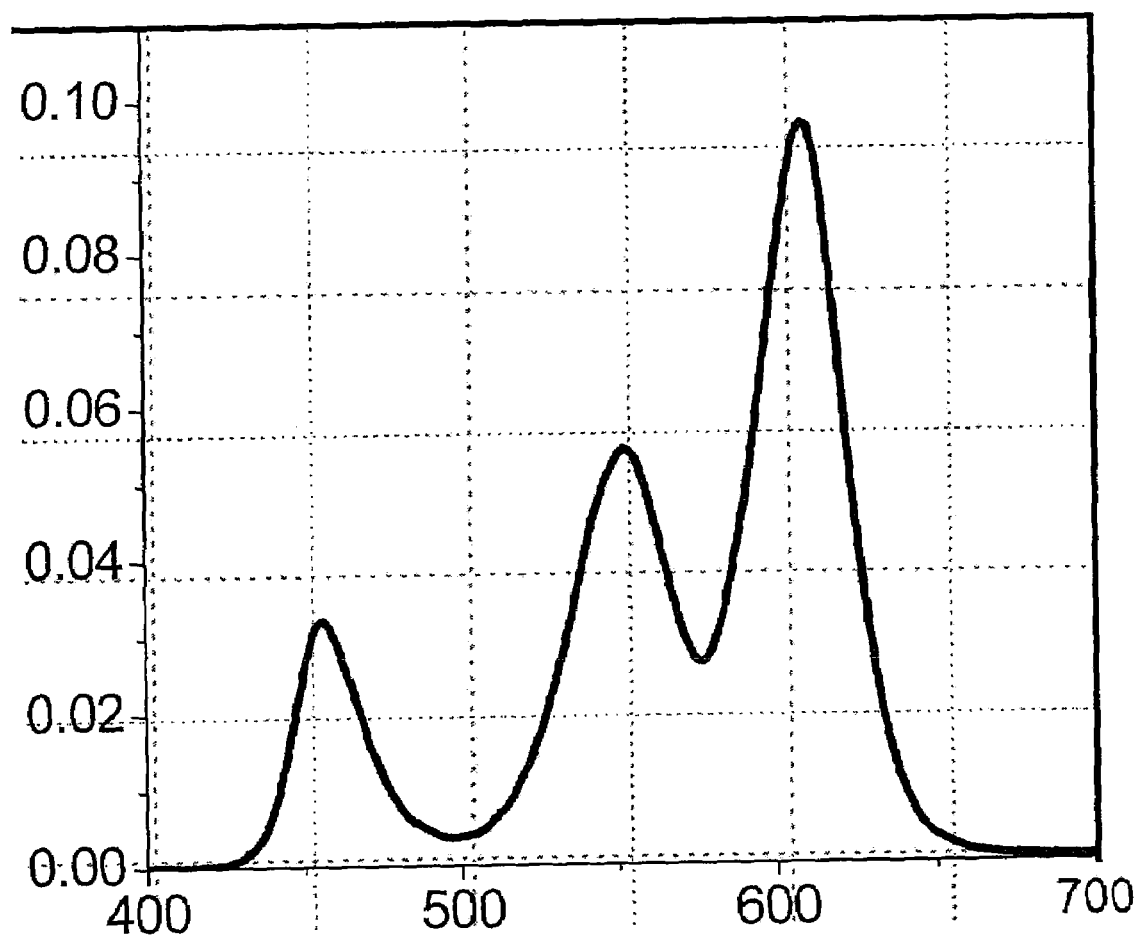
FIG. 7A shows the emission spectrum of a "warm white" light emitting device according to an embodiment of the invention.
Figure 7B:
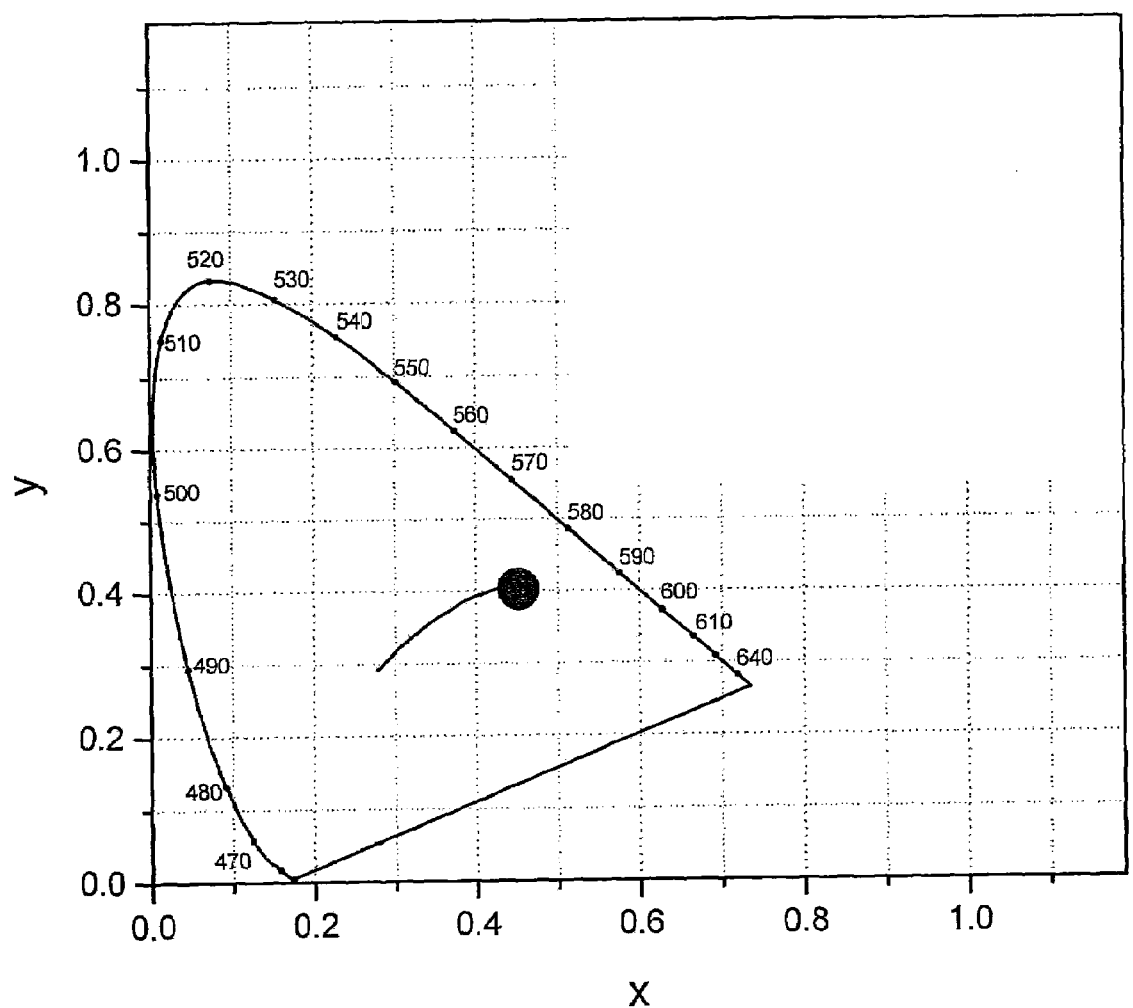
FIG. 7B shows the CIE coordinates of a "warm white" light emitting device according to an embodiment of the invention.

The white spectrum is composed of a blue source emission band at 460 nm, a green semiconductor nanocrystal emission band at 520 nm, and a orange-red semiconductor nanocrystal emission band at 606 nm. For the device prepared as described the spectrum corresponds to color coordinates of approximately (0.40, 0.45) of CIE 1931. The device performance showed an efficacy of about 41 lm/W, the color temperature was measured at 2800 K and the color rendering index for the device was measured at 88 CRI. The emission spectrum and CIE coordinates for the devices are shown in FIGS. 7A and 7B, respectively. As can be seen from the emission spectrum diagram, semiconductor nanocrystal complexes with peaks of approximately 606 nm and 520 nm and an underlying blue source emitting at approximately 450 nm, may be combined such that the power spectral distribution has peaks in a ratio of approximately 1, 0.58, and 0.27, respectively, to create "warm" whites.

Specialty Colors

Specialty colors may be defined as a color having a color coordinate that is not located on or near the Planckian white light locus or on or near the periphery of the CIE diagram which corresponds to monochromatic wavelengths. Specialty colors can be produced by adding one or more populations of luminescent nanocrystals onto an underlying blue (about 450-470 nm), violet (about 400-410 nm), or ultraviolet (about 380-390 nm) LED. In particular, deep red nanocrystals having a peak emission wavelength between about 600 nm and 650 nm may be added to blue LEDs to create purple, pink, and cherry red using increasing concentrations of nanocrystals. Gold, aqua, seafoam green, and other greens, can be created by adding about 520 nm to 560 nm nanocrystals to blue LEDs at various concentrations.

A green LED was fabricated in accordance with FIG. 1. In the example, a UV-curable resin, OP-54, may be used for the active layer, the first encapsulant layer, and the second encapsulant layer. Two devices were prepared with the delivered volumes of 1.7 µL, 0.7 µL, 5 µL and 1.7 µL, 0.9 µL, 5 µL, for the first encapsulant layer, the active layer, and the second encapsulant layer respectively.

The active layer was prepared by depositing 536 nm semiconductor nanocrystals complexes into OP-54 using known techniques at a concentration of 20 mg/mL. The solid-state light-emitting diode with the semiconductor nanocrystals of the present embodiment were found to have a very high efficacy 54 lm/W and 53 lm/W compared to the source LED efficacy 11 lm/W. The reasons for the high efficacy of the device are the high semiconductor nanocrystal conversion efficiency of the active layer 120 and high human eye sensitivity to green. Inherently, traditional semiconductor LEDs cannot achieve high efficiency in the green to orange region (540-590 nm). The efficiency of these LEDs has been on the order of 4-9 lm/W. For these colors, more than 60 percent conversion efficiency of the phosphor is viable in the LED light industry.

Figure 8A:
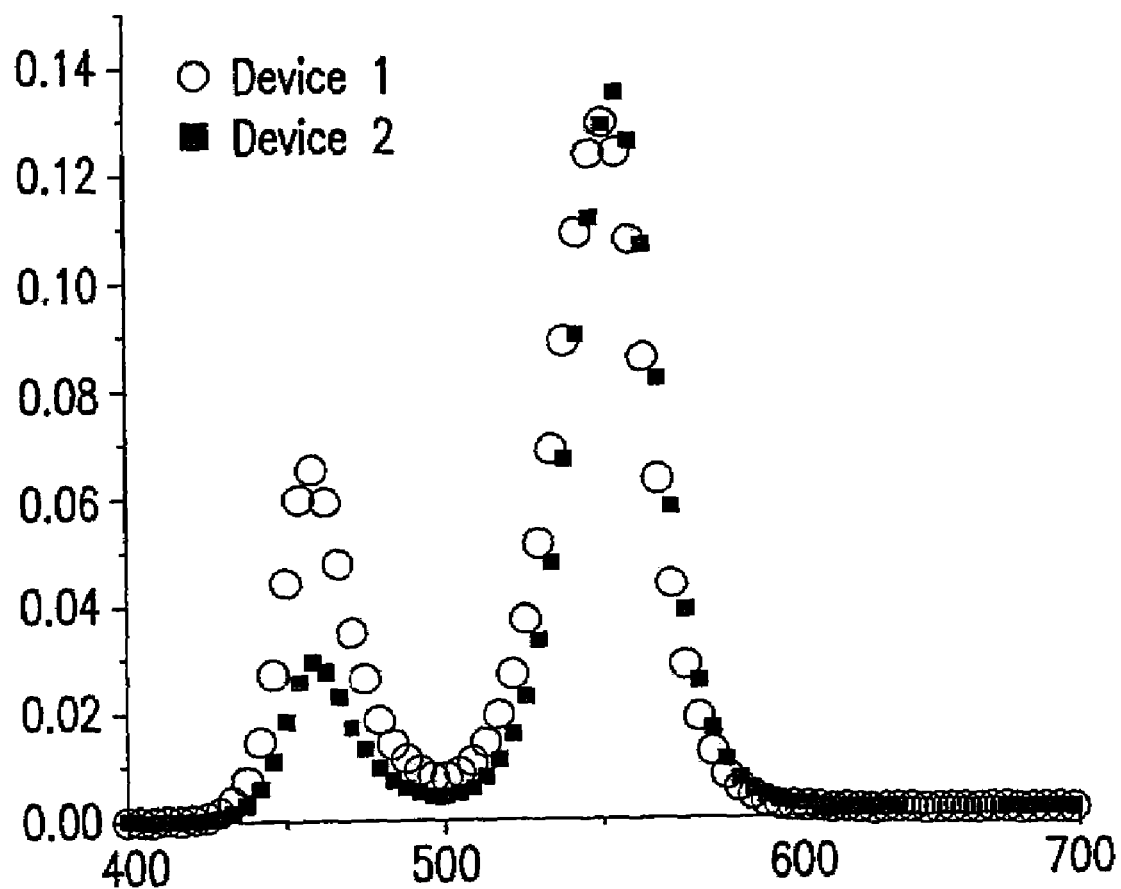
FIG. 8A shows the emission spectrum of a "green" light emitting device according to an embodiment of the invention.
Figure 8B:
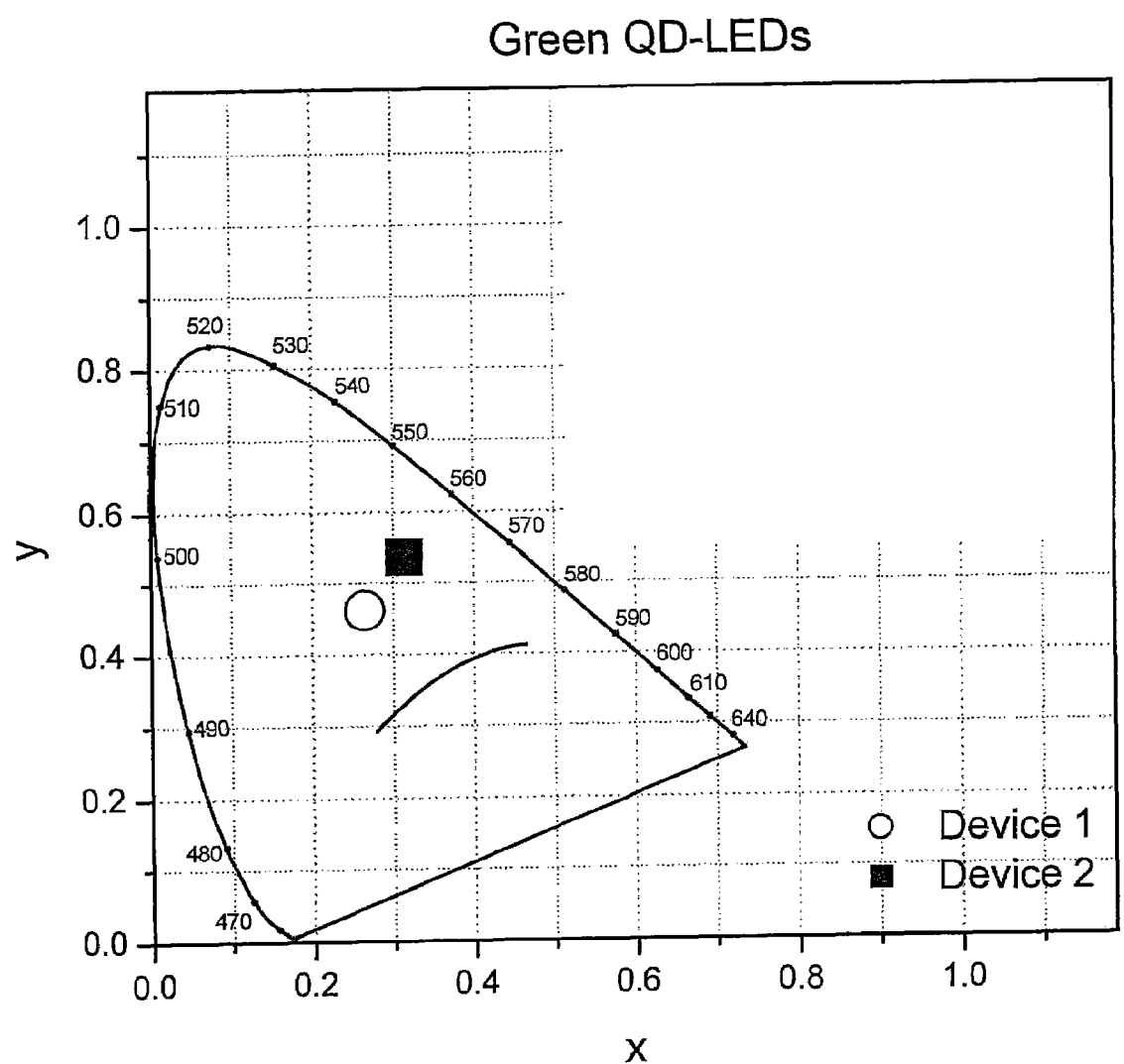
FIG. 8B shows the CIE coordinates of a "green" light emitting device according to an embodiment of the invention.

The green emission spectrum results from a blue source emission band at 460 nm, and a green semiconductor nanocrystal emission band at 550 nm. The emission spectrum and CIE coordinates for the devices are shown in FIGS. 8A and 8B, respectively. For the device prepared as described the spectrum corresponds to color coordinates of approximately (0.30, 0.50) of CIE 1931. As can be seen from the emission spectrum diagram, semiconductor nanocrystal complexes with peaks of approximately 550 and a blue source emitting at approximately 450 nm, may be combined such that the power spectral distribution has peaks in a ratio of approximately 1, 0.25, respectively, to create "green" emitting diodes.

Red, Green, and Blue Emitting Solid State Lighting Devices

Three exemplary red, green and blue emitting LEDs were prepared in accordance with FIG. 1 (nine total LEDs). In the examples, a UV-curable resin, OP-54, was used for the active layer (40), the first encapsulant layer (30), and the second encapsulant layer (50). Each of the nine devices were prepared with 1.7 µL of OP-54 for the first encapsulant layer and 4 µL of OP-54 for the second encapsulant layer. The active layers were prepared with 601 nm emitting semiconductor nanocrystal complexes for the red emitting diodes, 555 nm emitting semiconductor nanocrystal complexes for the green emitting diodes, and 530 nm emitting semiconductor nanocrystal complexes for the blue emitting diodes. The active layers were excited with a Cree chip LED.

Figure 9:
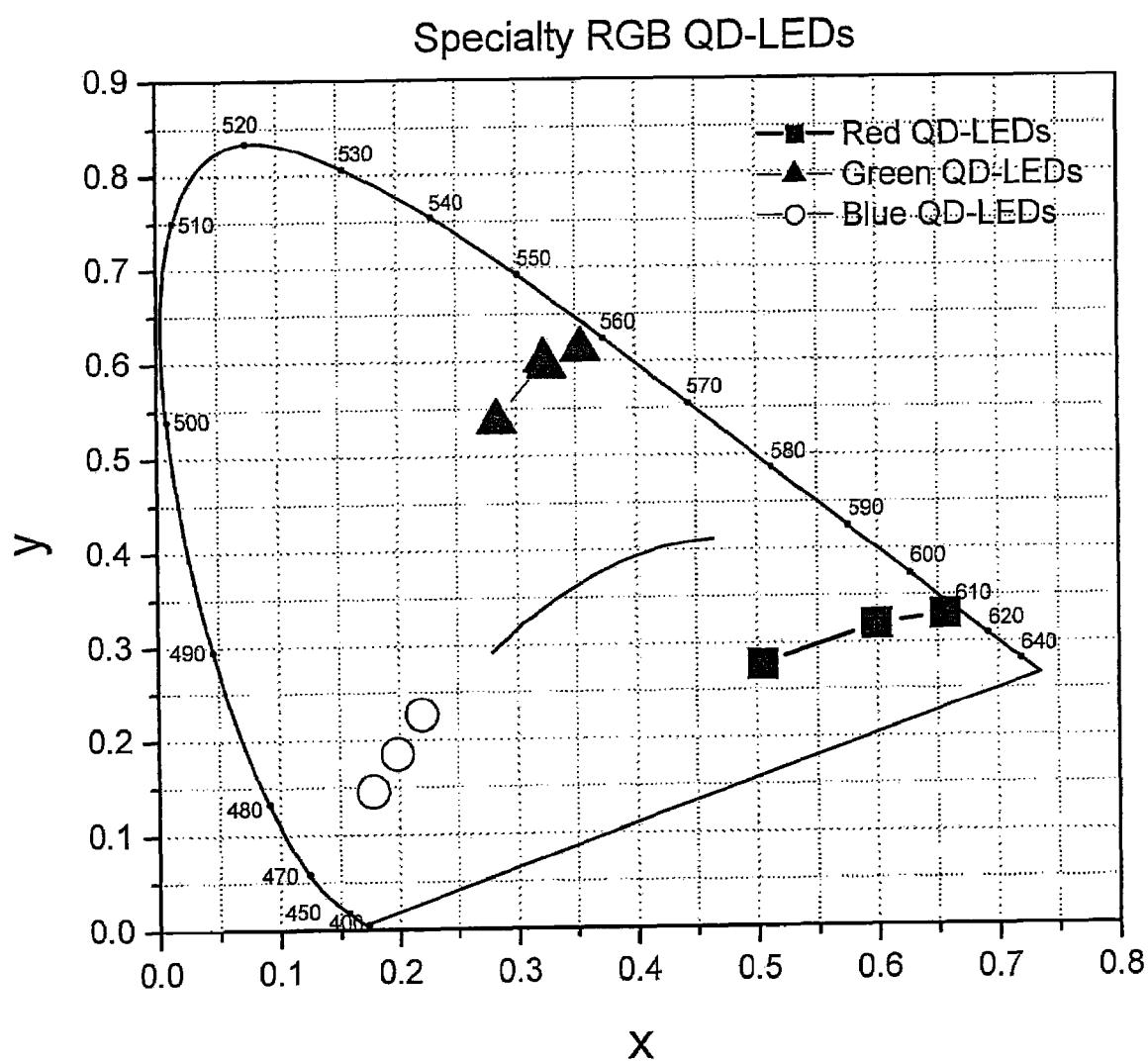
FIG. 9 shows CIE coordinates of light emitting devices having various emission spectra according to an embodiment of the invention.

The active layer was prepared by depositing 601 nm, 530 nm, or 555 nm semiconductor nanocrystals complexes into OP-54 using known techniques at a concentration of 20 mg/mL. The solid-state light-emitting diode with the semiconductor nanocrystals of the present embodiment were found to have a very high efficacy of 54 lm/W compared to the source LED efficacy 11 lm/W. The CIE coordinates for the devices are shown in FIG. 9. For the device prepared as described the spectrum corresponds to color coordinates of approximately (0.60, 0.31) of CIE 1931 for the red diodes, (0.325, 0.575) for the green diodes, and (0.20, 0.18) for the blue diodes.

Purple LED

A purple LED was fabricated in accordance with FIG. 1. In the example, a UV-curable resin, OP-54, may be used for the active layer (40), the first encapsulant layer (30), and the second encapsulant layer (50). Delivered volumes of 1.5 µL, and 5 µL, for the first encapsulant layer, the active layer, and the second encapsulant layer respectively were deposited onto the LED device.

The active layer was prepared by depositing 630 nm semiconductor nanocrystals complexes into OP-54 using known techniques at a concentration of 20 mg/mL. The solid-state light-emitting diode with the semiconductor nanocrystals of the present embodiment were found to have a conversion efficiency of approximately 78% (+7%). The LED driver chip used was a optosupply blue LED.

Figure 10A:
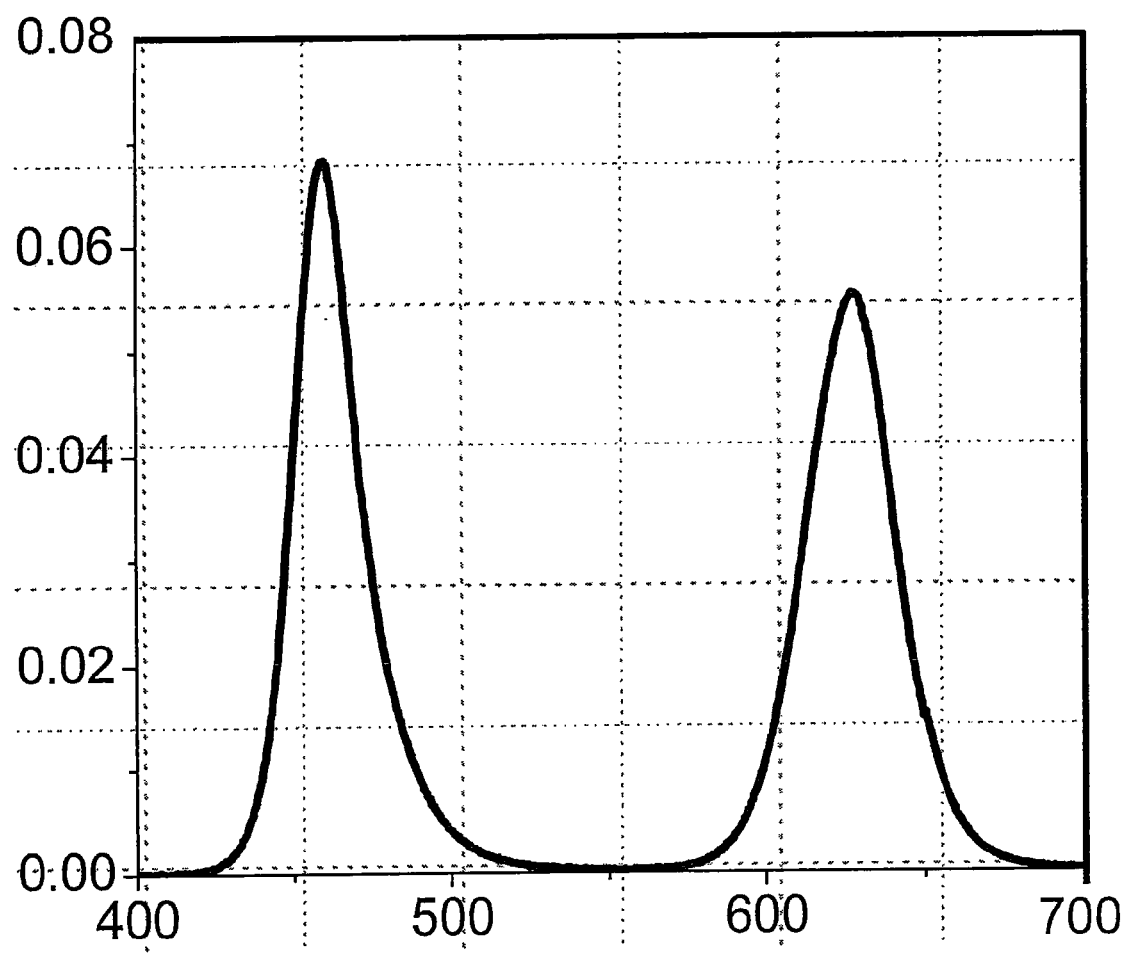
FIG. 10A shows the emission spectrum of a "purple" light emitting device according to an embodiment of the invention.
Figure 10B:
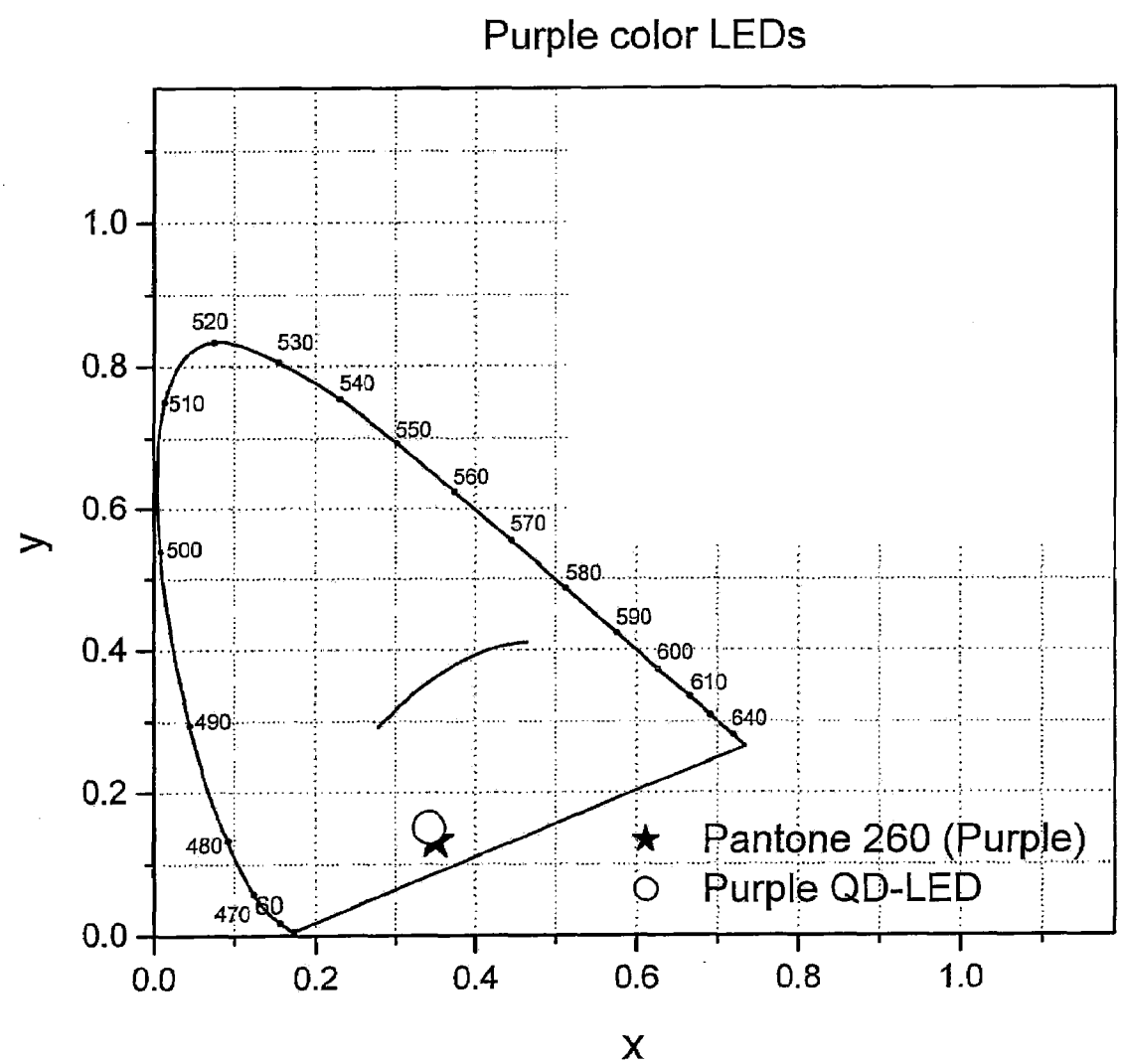
FIG. 10B shows the CIE coordinates of a "purple" light emitting device according to an embodiment of the invention.

The purple emission spectrum is composed of a blue source emission band at 460 nm, and a green semiconductor nanocrystal emission band at 550 nm. The emission spectrum and CIE coordinates for the devices are shown in FIGS. 10A and 10B, respectively. For the device prepared as described the spectrum corresponds to color coordinates of approximately (0.35, 0.15) of CIE 1931. As can be seen from the emission spectrum diagram, semiconductor nanocrystal complexes with peaks of approximately 630 and a blue source emitting at approximately 450 nm, may be combined such that the power spectral distribution has peaks in a ratio of approximately 1, 1.2, respectively, to create "purple" emitting diodes. As can be further seen from the below measurements, the purple LEDs prepared as such matches (per the CIE diagram) almost exactly, the Pantone 260 purple light emitting diodes.

Additional Specialty Colors

"Pearl White", "Deep Purple", "Pink", "Lime", "Pink", "Peach", "Aqua", and "Ice White" (cool White) emitting LEDs were produced by admixing green 530 nm emitting quantum dots, yellow 567 nm emitting semiconductor nanocrystals, orange 606 nm emitting nanocrystals, and red 612 nm emitting nanocrystals at various ratios in an encapsulent and applied to a blue emitting 460-470 nm emitting LED. The ratios and peak emission wavelengths were selected such that when applied to the blue LED, the desired spectral power distribution and hence the desired color coordinate was achieved:

| Color Name | CIE (x, y) Coordinates | Concen. (mg/mL) | Green (530 nm) | Yellow (567 nm) | Orange (606 nm) | Red (612 nm) |
|---|---|---|---|---|---|---|
| Pearl White | (0.334 ± 0.05, 0.361 ± 0.01) | 13.00 | 9 | | 1 | |
| Deep Purple | (0.226 ± 0.05, 0.100 ± 0.05) | 0.67 | | | | 1 |
| Pink | (0.445 ± 0.05, 0.022 ± 0.05) | 2.15 | | | | 1 |
| Lime | (0.292 ± 0.05, 0.589 ± 0.05) | 12.00 | 60 | | 1 | |
| Peach | (0.431 ± 0.05, 0.265 ± 0.05) | 6.60 | | 2 | 1 | |
| Aqua | (0.219 ± 0.05, 0.385 ± 0.10) | 6.25 | 1 | | | |
| Ice White | (0.270 ± 0.05, 0.290 ± 0.05) | 1.81 | 3.8 | | 1 | |

Figure 11A:
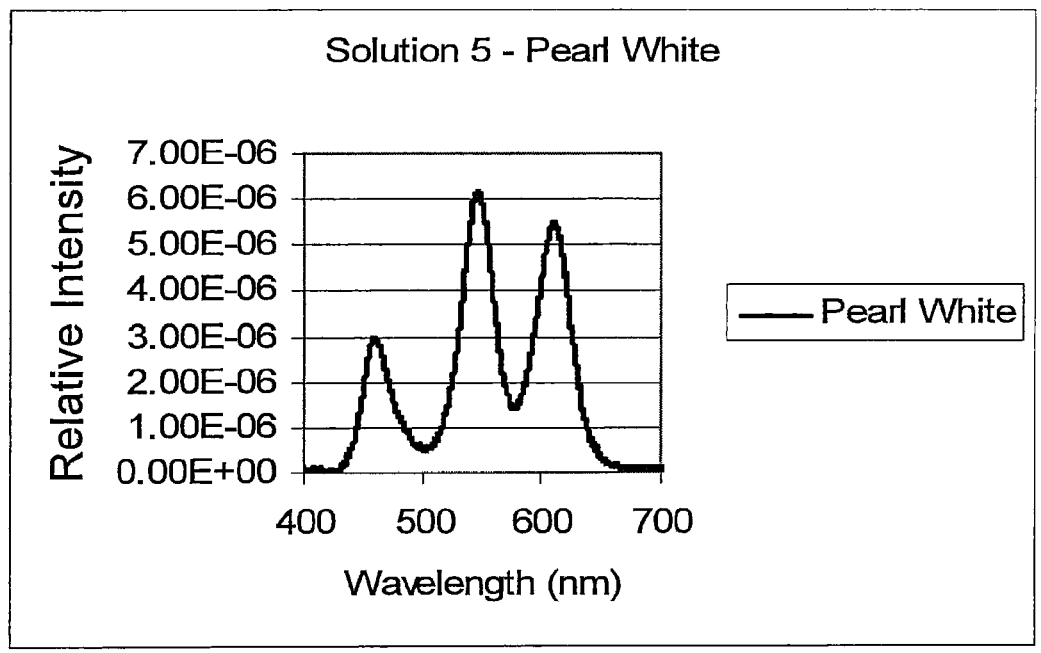
FIG. 11A shows the power spectral distribution of a "pearl white" light emitting device according to an embodiment of the invention.

A "pearl white" device with an emission color coordinate of about (0.334, 0.361) was achieved by mixing 530 nm green and 606 nm orange at a ratio of 9:1 and applying to the surface of a 470 nm LED at a total nanocrystal concentration of 13 mg/mL. The ratios of the peaks of blue, green and orange emission in the power spectral distribution were 3:6:5 as shown in FIG. 11A.

Figure 11B:
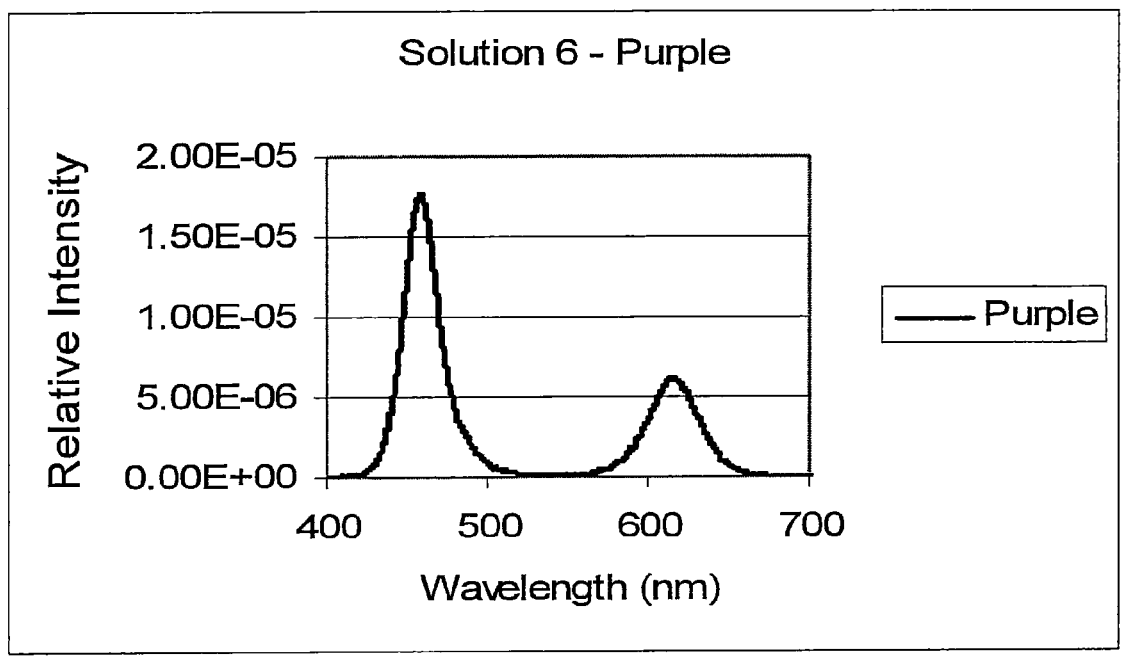
FIG. 11B shows the power spectral distribution of a "purple" light emitting device according to an embodiment of the invention.

A "deep purple" device with an emission color coordinate of about (0.226, 0.100) was achieved by adding 612 nm red and applying to the surface of a 470 nm LED at a total nanocrystal concentration of 0.67 mg/mL such that the ratios of the peaks of blue and red emission in the power spectral distribution were about 3.5:1, as shown in FIG. 11B.

Figure 11C:
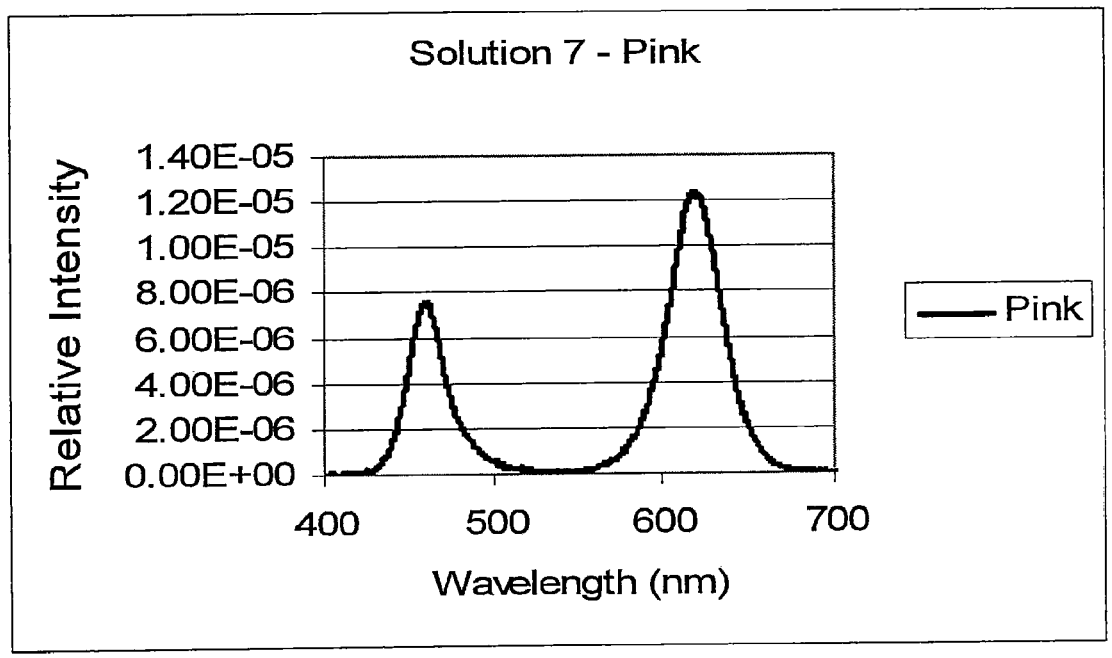
FIG. 11C shows the power spectral distribution of a "pink" light emitting device according to an embodiment of the invention.

A "pink" device with an emission color coordinate of about (0.445, 0.022) was achieved by adding 612 nm red and applying to the surface of a 470 nm LED at a total nanocrystal concentration of 2.15 mg/mL such that the ratios of the peaks of blue and red emission in the power spectral distribution were about 1:1.7 as shown in FIG. 11C.

Figure 11D:
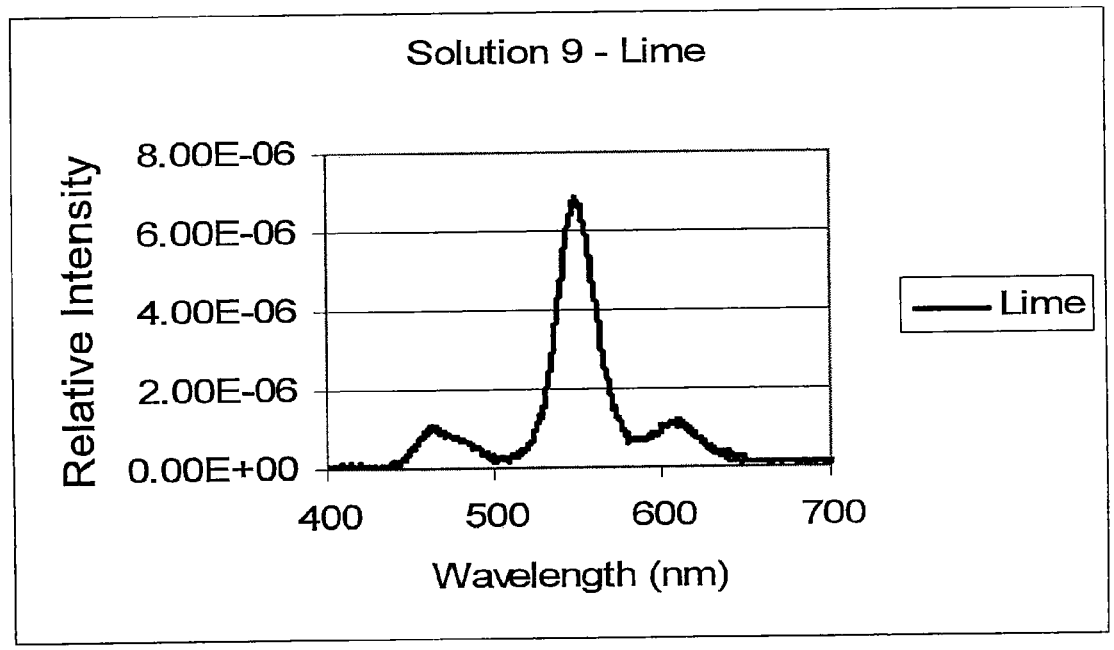
FIG. 11D shows the power spectral distribution of a "lime" light emitting device according to an embodiment of the invention.

A "lime" device with an emission color coordinate of about (0.292, 0.589) was achieved by adding 530 nm green and 606 nm orange at a ratio of 60:1 and applying to the surface of a 470 nm LED at a total nanocrystal concentration of 12 mg/mL such that the ratios of the peaks of blue, green, and orange emission in the power spectral distribution were about 1:7:1 as shown in FIG. 11D.

Figure 11E:
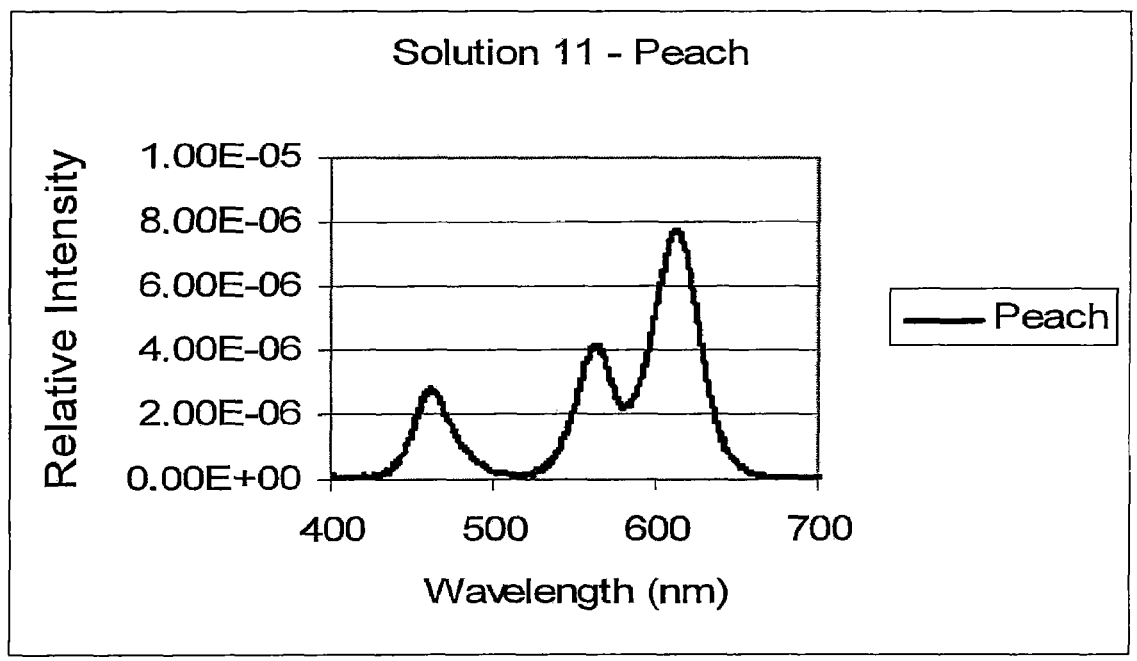
FIG. 11E shows the power spectral distribution of a "peach" light emitting device according to an embodiment of the invention.

A "peach" device with an emission color coordinate of about (0.431, 0.265) was achieved by adding 567 nm yellow and 606 nm orange at a ratio of 2:1 and applying to the surface of a 470 nm LED at a total nanocrystal concentration of 6.6 mg/mL such that the ratios of the peaks of blue, yellow, and orange emission in the power spectral distribution were about 1:2:4 as shown in FIG. 11E.

Figure 11F:
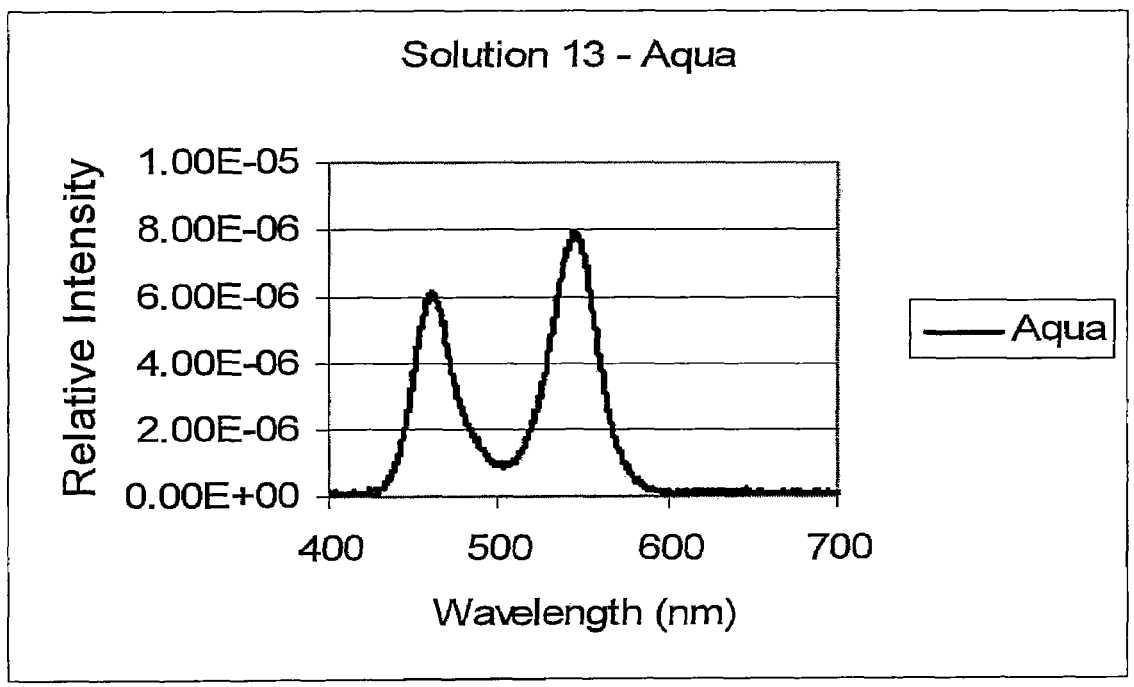
FIG. 11F shows the power spectral distribution of a "aqua" light emitting device according to an embodiment of the invention.

An "aqua" device with an emission color coordinate of about (0.219, 0.385) was achieved by adding 530 nm green and applying to the surface of a 470 nm LED at a total nanocrystal concentration of 6.25 mg/mL such that the ratios of the peaks of blue and green emission in the power spectral distribution were about 3:4 as shown in FIG. 11F.

Figure 11G:
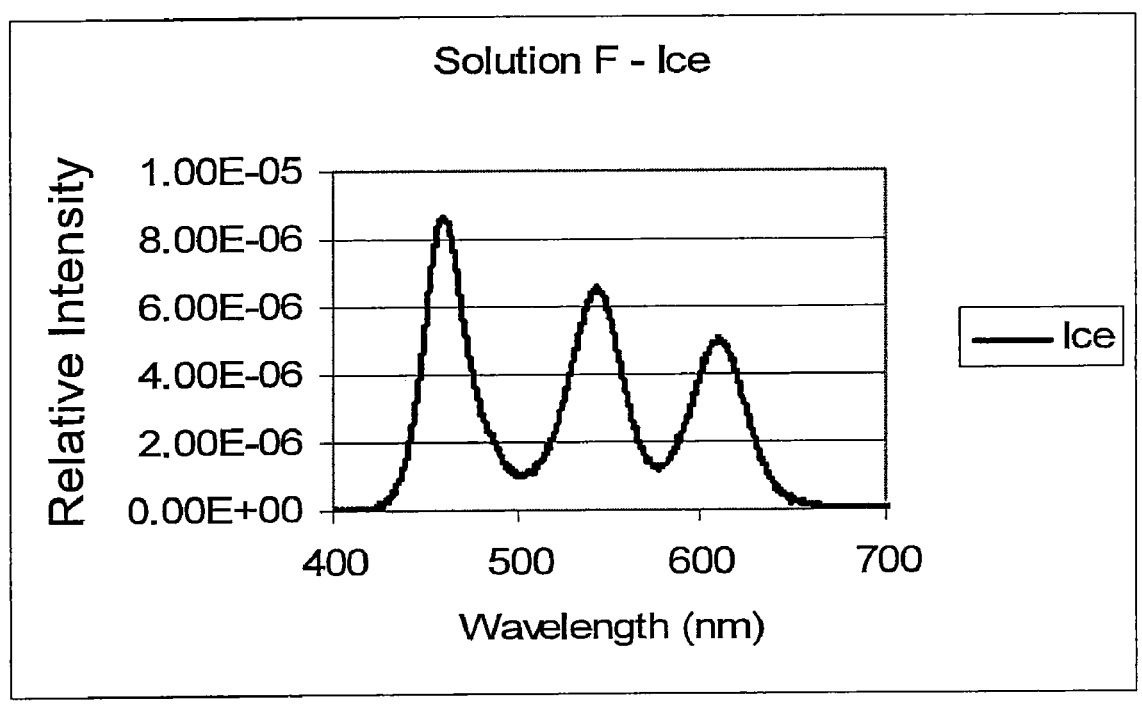
FIG. 11G shows the power spectral distribution of an "ice white" light emitting device according to an embodiment of the invention.

An "ice white" device having with an emission color coordinate of about (0.270, 0.290) was achieved by adding 530 nm green and 606 nm orange at a ratio of 2:1 and applying to the surface of a 470 nm LED at a total nanocrystal concentration of 1.81 mg/mL such that the ratios of the peaks of blue, green, and orange emission in the power spectral distribution were about 8:6:5, as shown in FIG. 11G.

Figure 12:
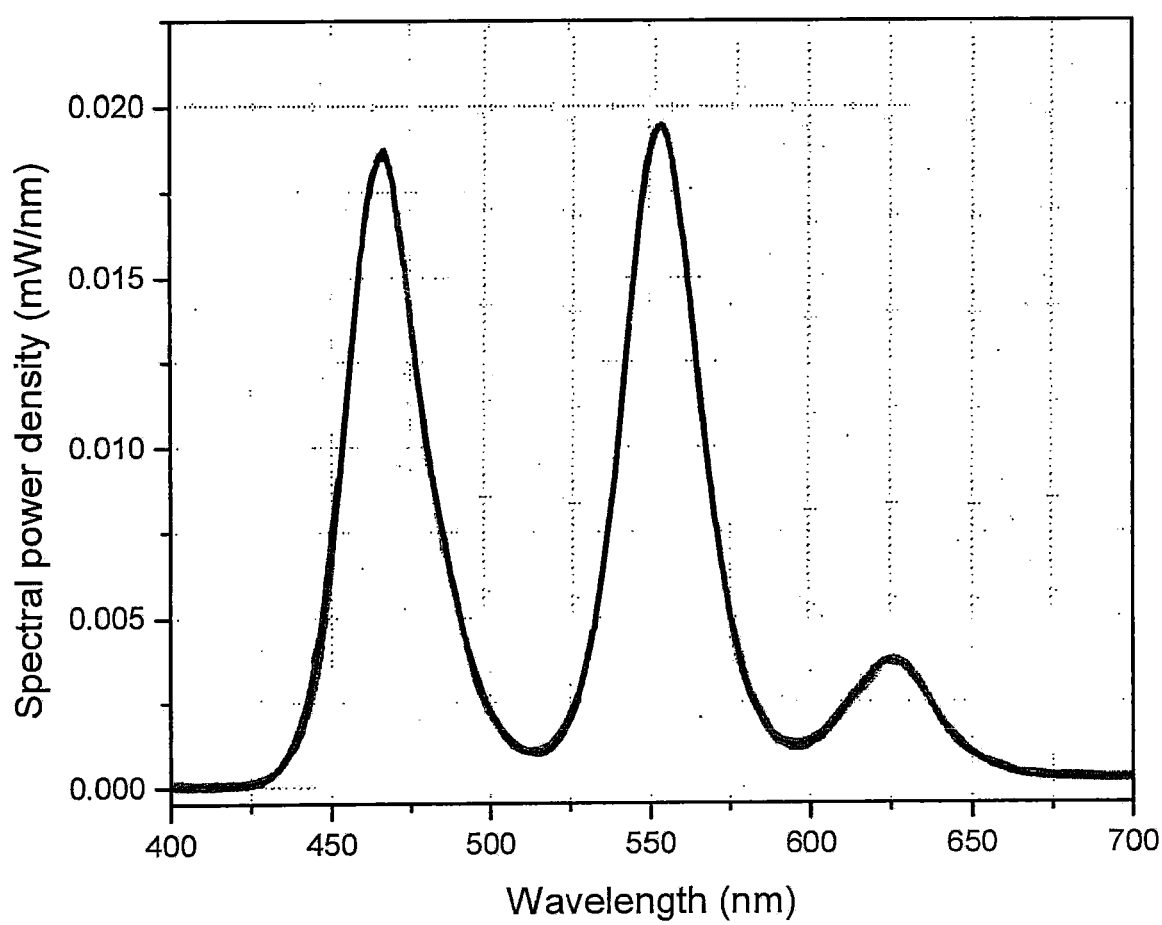
FIG. 12 shows the spectral power density of device having a multi-phosphor layer according to an embodiment of the invention.

Multi-phosphor Layer with Dual (Red and Yellow) Active Semiconductor Nanocrystal Layers A multi-phosphor layer device was fabricated as described above with respect to FIG. 3. The first encapsulant layer and the second encapsulant layer are the same as previous examples with OP-54 matrix, but instead of a single semiconductor nanocrystal active layer, two layers were used. The first active layer comprised red light-emitting semiconductor nanocrystals and the second layer comprised yellow light-emitting semiconductor nanocrystals. Specifically, 0.3 µL of 2.5 mg/mL red semiconductor nanocrystals in OP-54 was deposited on the first encapsulant layer and cured under UV irradiation. On top of the red semiconductor nanocrystal layer, 0.5 µL of OP-54 spacer film was made to space apart the semiconductor nanocrystal layers. Finally, 0.5 µL of yellow emitting semiconductor nanocrystals (20 mg/mL in Toluene solvent) was directly delivered on the spacer layer. To remove the remnant solvent in the layer, it was dried in a vacuum oven at 80 Celcius for 1 hour. The active layer was made with two emitting layers (red semiconductor nanocrystals\OP-54\yellow semiconductor nanocrystals). FIG. 12 shows the test results of the multi-phosphor layer. Each emission band and intensity can be adjusted by concentration and volume of the semiconductor nanocrystal phosphor.

Infrared Emission from Semiconductor Nanocrystal Phosphors on the LED

An infrared (IR) emitting LED was fabricated in accordance with FIG. 1. To generate IR emission, the concentration 10 mg/mL of PbS semiconductor nanocrystals were solvated in a matrix of 30 percent hardener and 70 percent silicone. The PbS semiconductor nanocrystal layer was placed between two encapsulant layers. For the purpose of the present embodiment each encapsulant layer was silicone. The delivered matrix volumes are 2, 1.5, and 8 µL for the layers 30, 40, and 50, respectively.

Figure 13:
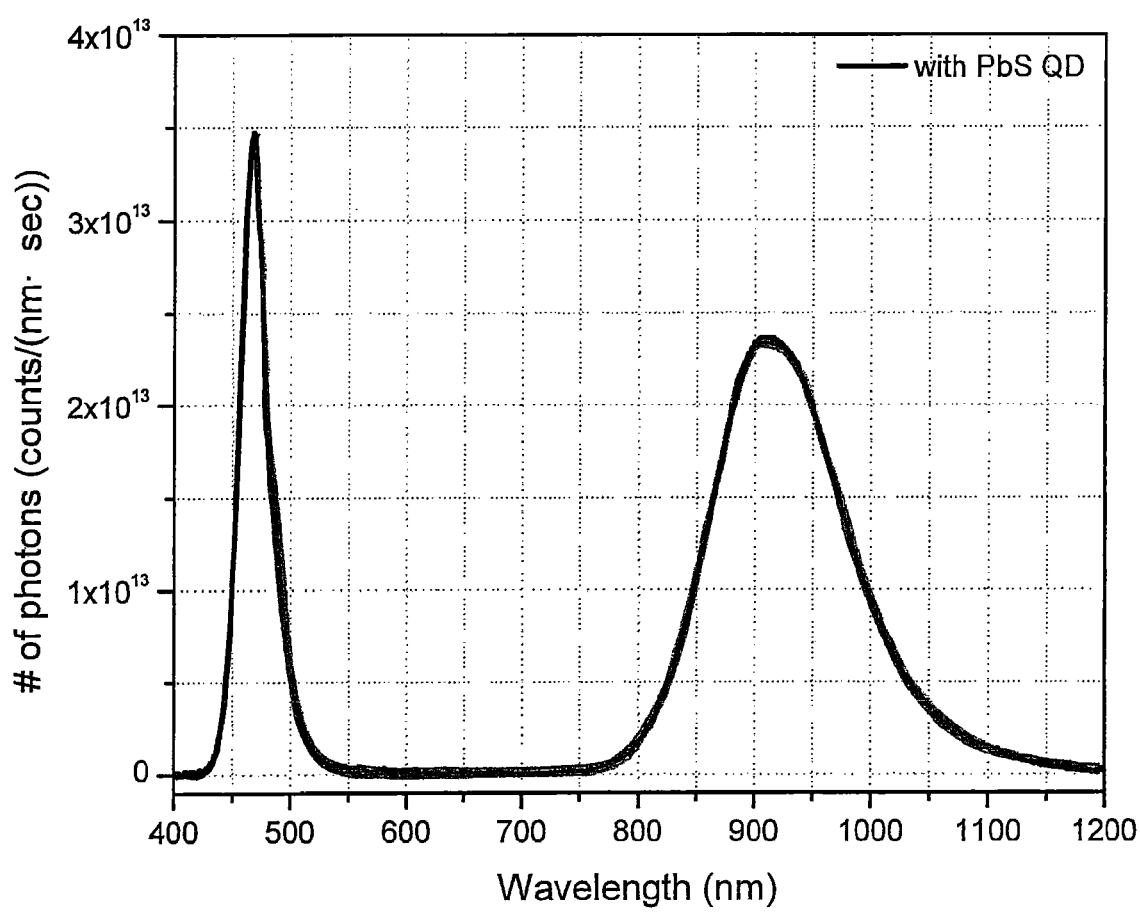
FIG. 13 shows the spectral response of an IR device according to an embodiment of the invention.

FIG. 13 shows the spectral response of the device. The blue band is the remnant source emission, which is not absorbed by the semiconductor nanocrystals. The PbS nanocrystal emission band is located at 910 nm with a very broad spectrum. The conversion efficiency of the PbS semiconductor nanocrystal device was measured to be 82 percent.

Device Stability

Figure 14:
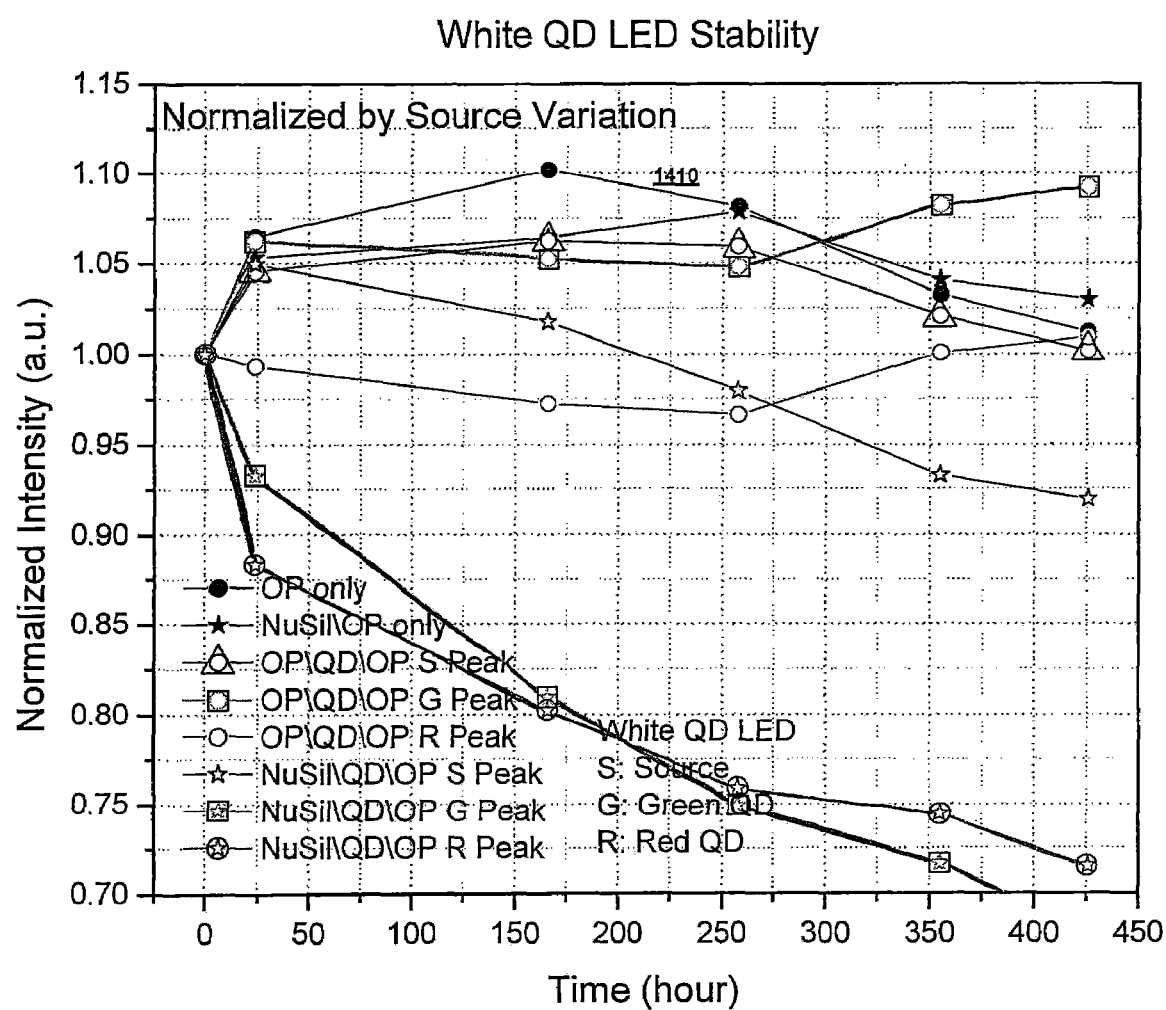
FIG. 14 shows the stability over time of devices fabricated according to the present invention.

One problem associated with the conventional use of semiconductor nanocrystal complexes as a phosphor is that nanocrystals may degrade over time due to photooxidation processes. It has been found that this drawback may be reduced or eliminated through the use of overlying oxygen barrier layers (the second encapsulent layer), and method of applying the first encapsulent layer, active layer, and second encapsulent layer. FIG. 14 shows the stability of devices fabricated according to embodiments of the present invention over time.

It has been found that the sequential application and curing of UV or thermal curing polyurethane acrylate (OP-54) first encapsulent layer, a polyurethane acrylate/nanocrystal active region, and polyurethane acrylate second encapsulent layer under vacuum greatly increasing stability. It is preferred that the encapsulent layers be thoroughly cured (>20 seconds under UV exposure) in order to achieve suitable low oxygen permeability.

It has also been found that the addition of nanoclays to the active region and/or second encapsulent layer significantly decreases oxygen permeability and thereby increases longevity. Lastly, it has been demonstrated that the use of oxygen barrier materials in the second encapsulent layer increases the nanocrystal stability and device longevity. Nonlimiting examples of barrier materials used as the second encapsulent layer include PVDC (saran), Sancure 777, polyvinyl alcohol (PVOH), and polyester.

Multi-chip Devices

Figure 16A:
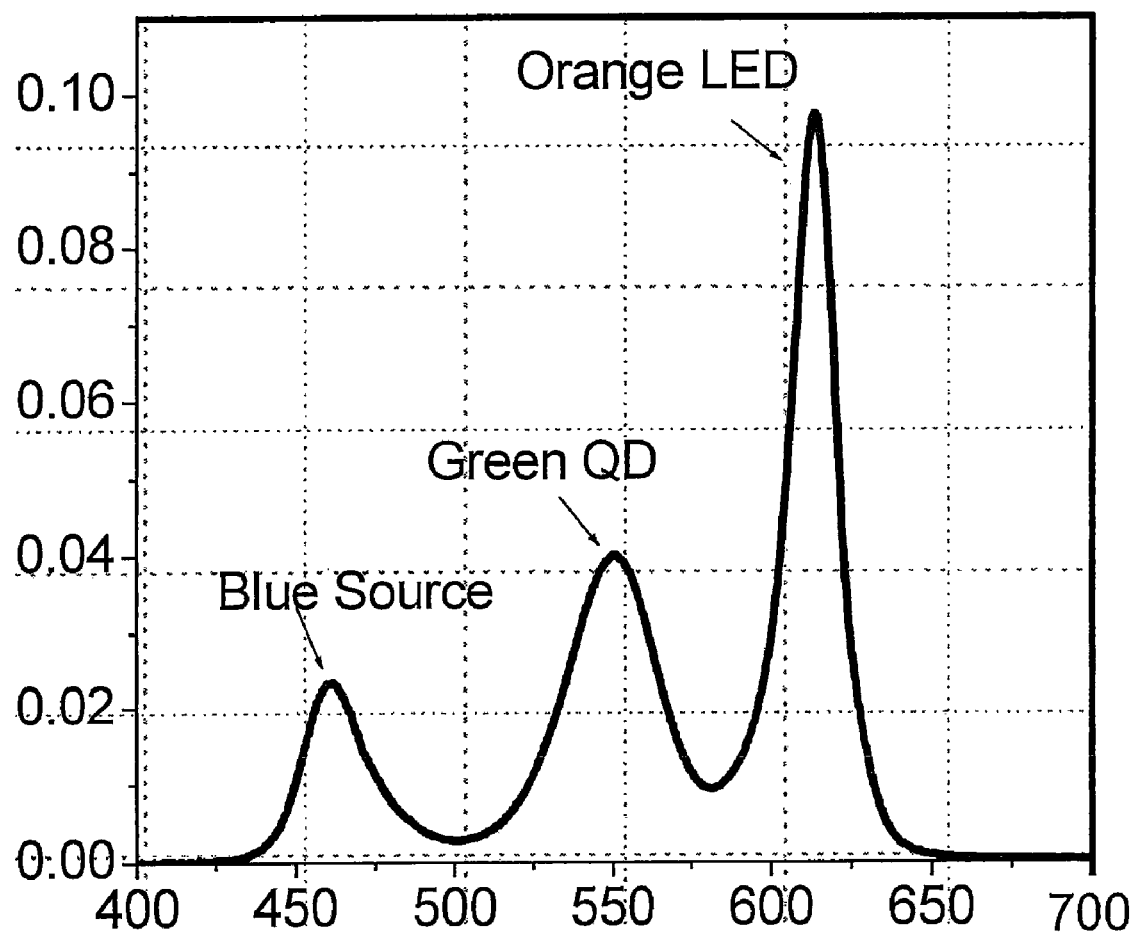
FIG. 16A shows the emission spectrum of a multi-chip light-emitting device according to an embodiment of the invention.
Figure 16B:
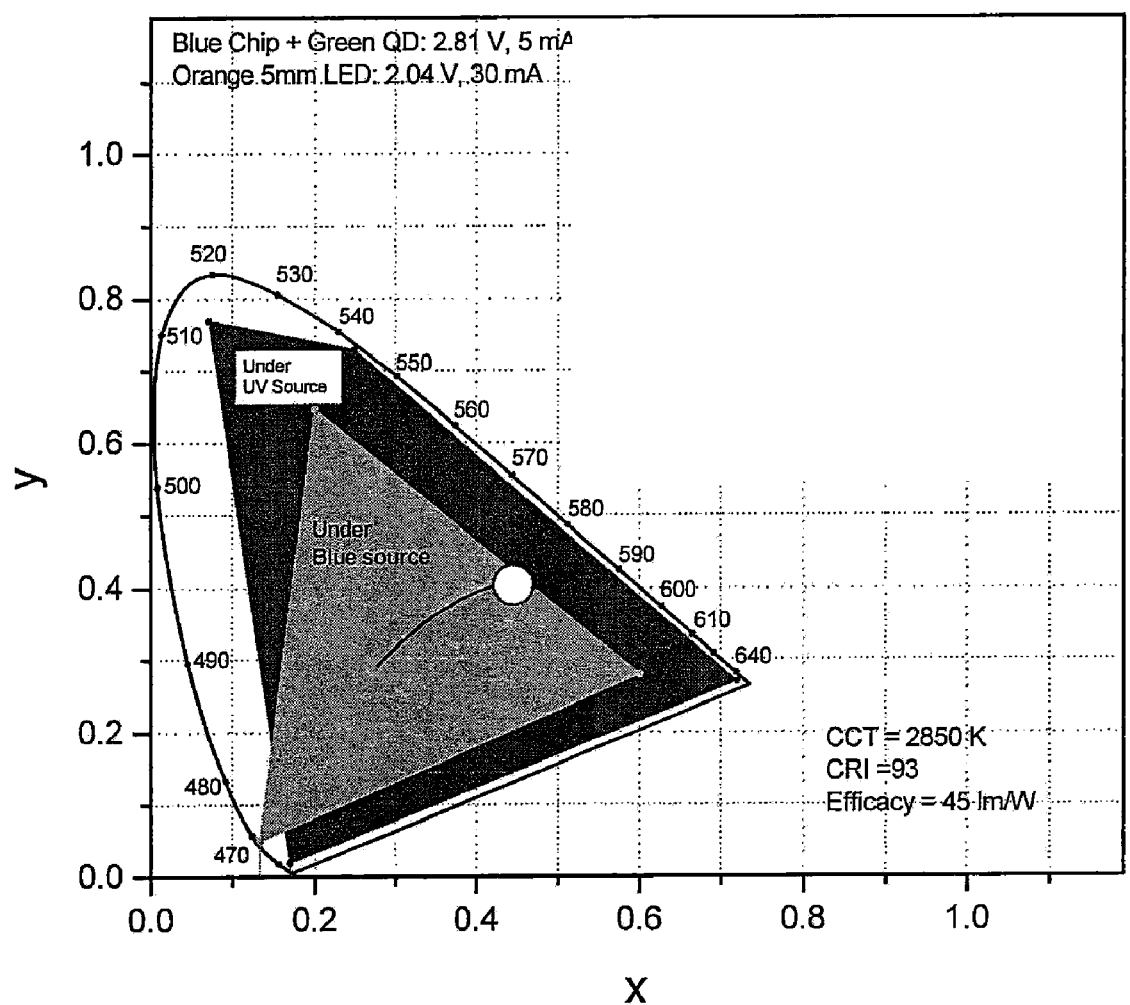
FIG. 16B shows the CIE coordinates for a multi-chip light-emitting device according to an embodiment of the invention.

FIGS. 16A and 16B show the emission spectrum and CIE coordinates, respectively, for a multi-chip device "warm white" (2800 K) light having a blue LED with a green nanocrystal coating and an orange LED. Specifically, the device had the following structure: "KJa023" (OP54 (1.7 μL)\CSS536 (0.5 μL, 20 mg/mL)\OP54 (5 μL) on the Blue LED)+610 nm Orange LED (5 mm lens head). The driving conditions were 5 mA at 2.81 V for the blue+green (KJa023) device and 30 mA at 2.04 V for the orange LED. The external power efficiencies were 13% at 20 mA for KJa023 and 3.6% at 30 mA for the orange LED. Efficacies were 58 lm/W at 20 mA for the KJa023 and 12 lm/W at 30 mA for the orange LED.

Figure 17:
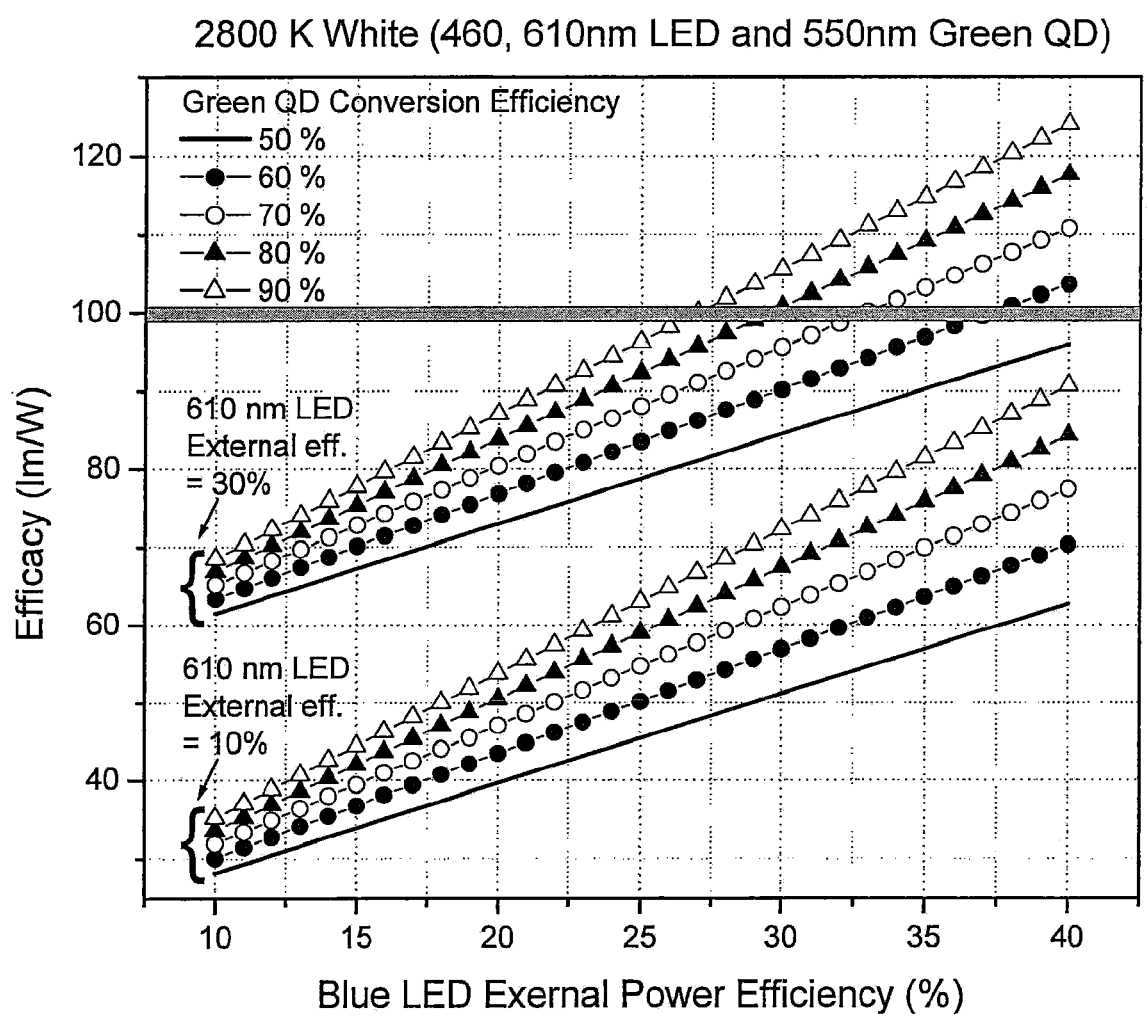
FIG. 17 shows efficacy predictions for a warm white (2800 K) emitting device according to an embodiment of the invention.
Figure 18:
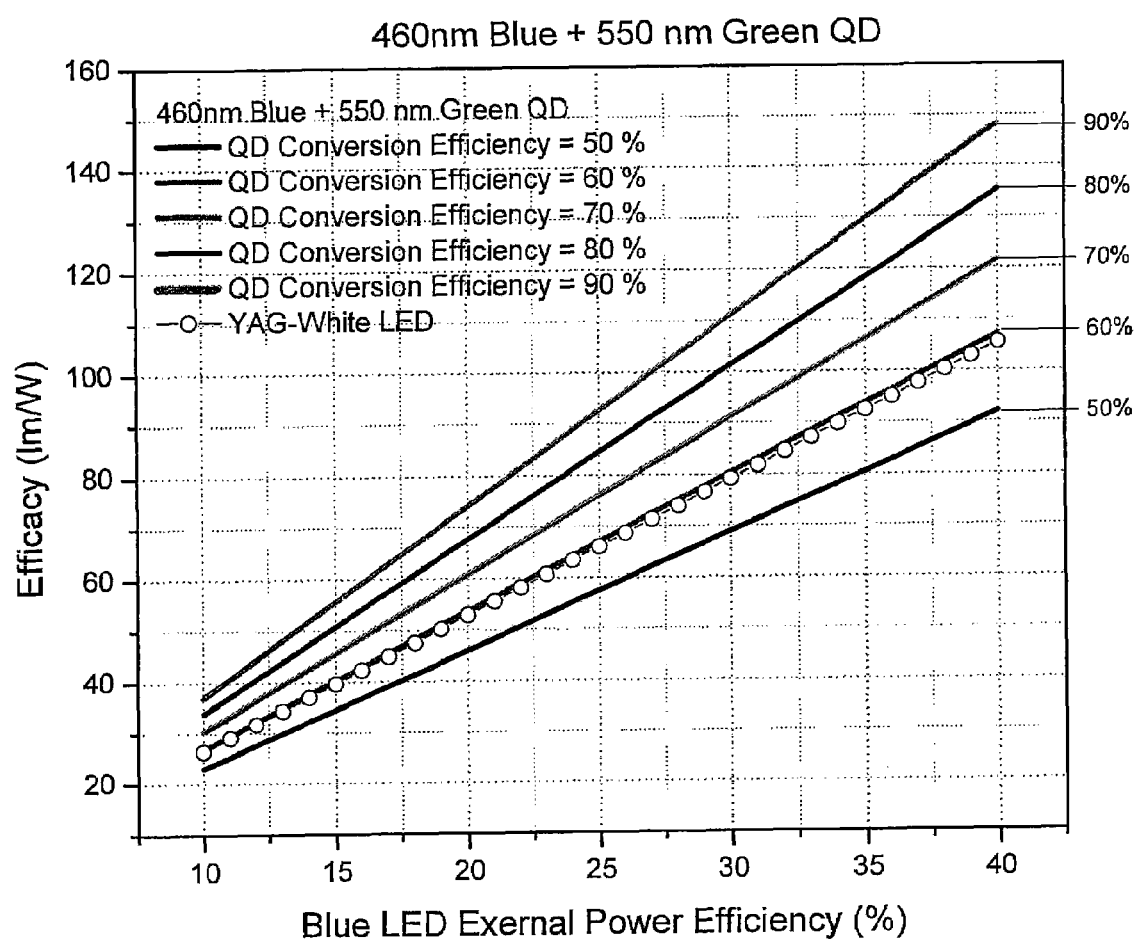
FIG. 18 shows calculated expected efficacies for a device incorporating a blue LED having a green nanocrystal layer according to an embodiment of the invention.

FIG. 17 shows the efficacy predictions for a warm white (2800 K) emitting device using blue and orange LEDs and a green nanocrystal layer. It is believed that an efficacy of about 58 lm/W is achievable using an orange LED with an efficiency of about 18%. It is believed that a 93 lm/W efficacy is achievably for a blue source having an external efficiency of about 35% coated with a green quantum dot layer having a conversion efficiency of about 60%, coupled with an orange LED having an external efficiency of about 28%. FIG. 18 shows the calculated expected efficacies for a blue LED having a green nanocrystal layer.

The foregoing description and examples have been set forth merely to illustrate the invention and are not intended as being limiting. Each of the disclosed aspects and embodiments of the present invention may be considered individually or in combination with other aspects, embodiments, and variations of the invention. Further, while certain features of embodiments of the present invention may be shown in only certain figures, such features can be incorporated into other embodiments shown in other figures while remaining within the scope of the present invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Moreover, it is appreciated, that although a number of problems and deficiencies may be identified herein, each embodiment may not solve each problem identified in the prior art. Additionally, to the extent a problem identified in the prior art or an advantage of the present invention is cured, solved, or lessened by the claimed invention, the solution to such problems or the advantage identified should not be read into the claimed invention. Furthermore, all references cited herein are incorporated by reference in their entirety.

What is claimed is:

1. A light-emitting device comprising:
   a light source having an underlying peak emission wavelength between 450 nm and 480 nm;
   an active layer disposed over the light source; and
   a population of nanocrystals disposed within the active layer, the nanocrystals capable of emitting light having a first peak emission wavelength of 612 nm;
   wherein the light emitted by the device corresponds to a pre-selected emission color having a CIE coordinate chosen from the group consisting of: (0.226±0.05, 0.100±0.05) and (0.445±0.05, 0.022±0.05).

2. The light-emitting device of claim 1 wherein the device emits light having a spectrum corresponding to a specialty color.

3. The light-emitting device of claim 1 wherein the light source is a light-emitting diode chip.

4. A light-emitting device comprising:
   a light-emitting diode chip having an underlying peak emission wavelength between 450 nm and 480 nm;
   an active layer disposed over the light-emitting diode chip;
   a first population of nanocrystals disposed within the active layer, the first population of nanocrystals capable of emitting light having a first peak emission wavelength;
   a second population of nanocrystals disposed within the active layer, the second population of nanocrystals capable of emitting light having a second peak emission wavelength, the second peak emission wavelength being different from the first peak emission wavelength; and
   wherein the first peak emission wavelength is selected from a group consisting of: 520 nm, 530 nm, 550 nm, and 567 nm;
   in the case that the first peak emission wavelength is 520 nm, the second peak emission wavelength is 606 nm, and the device emits light having a CIE coordinate of about (0.40±0.05, 0.45±0.05); and
   in the case that the first peak emission wavelength is 530 nm, the second peak emission wavelength is 610 nm, and the device emits light having a CIE coordinate of about (0.35±0.05, 0.35±0.05); and
   in the case that the first peak emission wavelength is 550 nm, the second peak emission wavelength is 600 nm, and the device emits light having a CIE coordinate of about (0.27±0.05, 0.28±0.05); and
   in the case that the first peak emission wavelength is 567 nm, the second peak emission wavelength is 606 nm, and the device emits light having a CIE coordinate of about (0.43 1±0.05, 0.265±0.05).

5. The device of claim 4 wherein the relative concentrations of the first population of nanocrystals and the second population of nanocrystals within the active layer cause the device to emit light having a spectral distribution corresponding to a selected color.

6. The device of claim 4 wherein the relative concentrations of the first population of nanocrystals and the second population of nanocrystals within the active layer cause the device to emit light having a spectral distribution corresponding to a specialty color.

7. The device of claim 4 wherein the device emits white light having a CRI of at least 88.

8. The device of claim 4 wherein the first peak emission wavelength is 535 nm -545 nm, and the first population of nanocrystals has a quantum yield of at least 70% when emitting light.

9. The device of claim 4 wherein the second peak emission wavelength is 605 nm -615 nm, and the first population of nanocrystals has a quantum yield of at least 70% when emitting light.

10. The device of claim 4, wherein the first peak emission wavelength is 520 nm, the second peak emission wavelength is 606 nm, and the device emits light having a CIE coordinate of about (0.40±0.05, 0.45±0.05).

11. The device of claim 4, wherein the first peak emission wavelength is 530 nm, the second peak emission wavelength is 610 nm, and the device emits light having a CIE coordinate of about (0.35±0.05, 0.35±0.05).

12. The device of claim 4, wherein the first peak emission wavelength is 550 nm, the second peak emission wavelength is 600 nm, and the device emits light having a CIE coordinate of about (0.27±0.05, 0.28±0.05).

13. The device of claim 4, wherein the first peak emission wavelength is 567 nm, the second peak emission wavelength is 606 nm, and the device emits light having a CIE coordinate of about (0.43 1±0.05, 0.265±0.05).

14. A light-emitting device comprising:
a first LED chip configured to emit light at a first wavelength;
a second LED chip configured to emit light at a second wavelength different from the first wavelength;
a first active layer disposed over the first LED chip;
a first population of nanocrystals disposed within the active layer, the nanocrystals configured to emit light at a third wavelength different from the first and second wavelengths;
a third LED chip configured to emit light at a fourth wavelength different from the first and second wavelengths;
a second active layer disposed over the third LED chip; and
a second population of nanocrystals disposed in the second active layer, the second population of nanocrystals configured to emit light at a fifth wavelength different from the third wavelength.

15. The device of claim 14, wherein light emitted from the device falls on the Planikian locus.

16. The device of claim 14, wherein the device emits 2800 K white light.

17. The device of claim 14, wherein the device emits light having a CRI of at least 88.

18. The device of claim 14, wherein the first wavelength is in the blue region of the visible spectrum, the second wavelength is in the red region of the visible spectrum, and the third wavelength is in the green region of the visible spectrum.

19. The device of claim 14, wherein the first wavelength is about 460 nm, the second wavelength is about 610 nm, and the third wavelength is about 550 nm.

20. The device of claim 14, wherein the device emits white light with an efficacy of at least 58 lm/W.

21. The device of claim 14, wherein the device emits white light with an efficacy of at least 93 lm/W.

22. A light-emitting device comprising:
a light-emitting diode chip having an underlying peak emission wavelength between 450 nm and 480 nm;
an active layer disposed over the light-emitting diode chip;
a first population of nanocrystals disposed within the active layer, the first population of nanocrystals capable of emitting light having a first peak emission wavelength of 530 nm;
a second population of nanocrystals disposed within the active layer, the second population of nanocrystals capable of emitting light having a second peak emission wavelength of 606 nm; and
wherein a ratio of the first population of nanocrystals to the second population of nanocrystals is selected from a group consisting of: the ratio of the first population of nanocrystals to the second population of nanocrystals is 60:1, and the device emits light having a CIE coordinate of (0.292±0.05, 0.589±0.05); the ratio of the first population of nanocrystals to the second population of nanocrystals is 9:1, and the device emits light having a CIE coordinate of (0.334±0.05, 0.361±0.05); and the ratio of the first population of nanocrystals to the second population of nanocrystals is 2:1, and the device emits light having a CIE coordinate of (0.270±0.05, 0.290±0.05).

23. A light-emitting device comprising:
a light-emitting diode chip having an underlying peak emission wavelength between 450 nm and 480 nm;
an active layer disposed over the light-emitting diode chip;
a first population of nanocrystals disposed within the active layer, the first population of nanocrystals capable of emitting light having a first peak emission wavelength of 525 nm 535 nm;
a second population of nanocrystals disposed within the active layer, the second population of nanocrystals capable of emitting light having a second peak emission wavelength of 601 nm611 nm; and
wherein a power spectral distribution ratio of light emitted by the device is selected from a group consisting of: a blue:green:orange power spectral distribution ratio of 3:6:5, a blue:green:orange power spectral distribution ratio of 8:6:5, a blue:green:orange power spectral distribution ratio of 1:2:3 and a blue:yellow:orange power spectral distribution ratio of 1:2:4.

24. The device of claim 23, wherein the blue:green:orange power spectral distribution ratio is 3:6:5.

25. The device of claim 23, wherein the blue:green:orange power spectral distribution ratio is 8:6:5.

26. The device of claim 23, wherein the blue:green:orange power spectral distribution ratio is 1:2:3.

27. The device of claim 23, wherein the blue:yellow:orange power spectral distribution ratio is 1:2:4.

28. A light-emitting device comprising:
a light-emitting diode chip having an underlying peak emission wavelength between 450 nm and 480 nm;
an active layer disposed over the light-emitting diode chip;
a first population of nanocrystals disposed within the active layer, the first population of nanocrystals capable of emitting light having a first peak emission wavelength of 525 nm 535 nm;
a second population of nanocrystals disposed within the active layer, the second population of nanocrystals capable of emitting light having a second peak emission wavelength of 605 nm 615 nm; and
wherein a blue:green:red power spectral distribution ratio of light emitted by the device is 4:3:3.

29. A light-emitting device comprising:
a light-emitting diode chip having an underlying peak emission wavelength between 450 nm and 480 nm;
an active layer disposed over the light-emitting diode chip;
a first population of nanocrystals disposed within the active layer, the first population of nanocrystals capable of emitting light having a first peak emission wavelength of 535 nm 545 nm;
a second population of nanocrystals disposed within the active layer, the second population of nanocrystals capable of emitting light having a second peak emission wavelength of 595 nm 605 nm; and
wherein a blue:green:orange power spectral distribution ratio of light emitted by the device is 7:3:2.

30. A light-emitting device comprising:
a light-emitting diode chip having an underlying peak emission wavelength between 450 nm and 480 nm;
an active layer disposed over the light-emitting diode chip;
a first population of nanocrystals disposed within the active layer, the first population of nanocrystals capable of emitting light having a first peak emission wavelength of 562 nm 572 nm;

a second population of nanocrystals disposed within the active layer, the second population of nanocrystals capable of emitting light having a second peak emission wavelength of 601 nm611 nm; and wherein a blue:yellow:orange power spectral distribution ratio of light emitted by the device is 1:2:4.

* * * * *